United States Patent
Kim et al.

(10) Patent No.: US 9,997,699 B2
(45) Date of Patent: Jun. 12, 2018

(54) SEMICONDUCTOR DEVICE HAVING MAGNETIC TUNNEL JUNCTION STRUCTURE AND METHOD OF FABRICATING THE SAME

(71) Applicants: Juhyun Kim, Hwaseong-si (KR); Kiwoong Kim, Hwaseong-si (KR); Sechung Oh, Yongin-si (KR); Woochang Lim, Seongnam-si (KR)

(72) Inventors: Juhyun Kim, Hwaseong-si (KR); Kiwoong Kim, Hwaseong-si (KR); Sechung Oh, Yongin-si (KR); Woochang Lim, Seongnam-si (KR)

(73) Assignee: SAMSUNG ELECTRONICS CO., LTD. (KR)

(*) Notice: Subject to any disclaimer, the term of this patent is extended or adjusted under 35 U.S.C. 154(b) by 0 days. days.

(21) Appl. No.: 15/158,575

(22) Filed: May 18, 2016

(65) Prior Publication Data
US 2017/0084821 A1 Mar. 23, 2017

(30) Foreign Application Priority Data
Sep. 18, 2015 (KR) .................. 10-2015-0132504

(51) Int. Cl.
| H01L 43/02 | (2006.01) |
| H01L 43/08 | (2006.01) |
| H01L 43/10 | (2006.01) |
| H01L 43/12 | (2006.01) |

(52) U.S. Cl.
CPC .............. *H01L 43/12* (2013.01); *H01L 43/08* (2013.01)

(58) Field of Classification Search
CPC ................................ H01L 43/08; H01L 43/12
See application file for complete search history.

(56) References Cited

U.S. PATENT DOCUMENTS

| 6,083,764 A | 7/2000 | Chen |
| 6,183,859 B1 | 2/2001 | Chen et al. |
| 6,205,052 B1 | 3/2001 | Slaughter et al. |
| 6,261,646 B1 | 7/2001 | Chen et al. |
| 6,465,262 B2 | 10/2002 | Kang et al. |
| 6,542,398 B2 | 4/2003 | Kang et al. |
| 6,548,849 B1 | 4/2003 | Pan et al. |
| 6,642,595 B1 | 11/2003 | Hung et al. |
| 6,657,431 B2 | 12/2003 | Xiao |
| 6,703,654 B1 | 3/2004 | Horng et al. |
| 6,756,237 B2 | 6/2004 | Xiao et al. |
| 6,815,248 B2 | 11/2004 | Leuschner et al. |
| 6,882,509 B2 | 4/2005 | Chang et al. |
| 6,903,396 B2 | 6/2005 | Tuttle |

(Continued)

*Primary Examiner* — Raj R Gupta
(74) *Attorney, Agent, or Firm* — Renaissance IP Law Group LLP

(57) ABSTRACT

A semiconductor device and a method of forming the semiconductor device are disclosed. The semiconductor device includes a lower electrode and a magnetic tunnel junction structure disposed on the lower electrode. The magnetic tunnel junction structure includes a seed pattern disposed on the lower electrode. The seed pattern includes an amorphous seed layer and an oxidized seed layer disposed on a surface of the amorphous seed layer. The seed pattern may prevent the lattice structure of the lower electrode from adversely affecting the lattice structure of a pinned magnetic layer of the magnetic tunnel junction structure.

19 Claims, 26 Drawing Sheets

(56) References Cited

U.S. PATENT DOCUMENTS

| | | |
|---|---|---|
| 6,909,129 B2 | 6/2005 | Kim et al. |
| 6,927,075 B2 | 8/2005 | Guo |
| 6,952,364 B2 | 10/2005 | Lee et al. |
| 6,960,480 B1 | 11/2005 | Horng et al. |
| 6,974,708 B2 | 12/2005 | Horng et al. |
| 6,979,526 B2 | 12/2005 | Ning |
| 7,043,823 B2 | 5/2006 | Childress et al. |
| 7,045,368 B2 | 5/2006 | Hong et al. |
| 7,045,841 B2 | 5/2006 | Hong et al. |
| 7,067,330 B2 | 6/2006 | Min et al. |
| 7,105,372 B2 | 9/2006 | Min et al. |
| 7,122,386 B1 | 10/2006 | Torng et al. |
| 7,122,852 B2 | 10/2006 | Horng et al. |
| 7,132,707 B2 | 11/2006 | Min et al. |
| 7,201,947 B2 | 4/2007 | Liao et al. |
| 7,208,807 B2 | 4/2007 | Horng et al. |
| 7,211,447 B2 | 5/2007 | Horng et al. |
| 7,211,874 B2 | 5/2007 | Guo et al. |
| 7,217,577 B2 | 5/2007 | Horng et al. |
| 7,238,540 B2 | 7/2007 | Honjo et al. |
| 7,238,979 B2 | 7/2007 | Horng et al. |
| 7,259,025 B2 | 8/2007 | Leuschner et al. |
| 7,264,974 B2 | 9/2007 | Horng et al. |
| 7,265,404 B2 | 9/2007 | Cao et al. |
| 7,277,318 B2 | 10/2007 | Yoda et al. |
| 7,304,360 B2 | 12/2007 | Guo et al. |
| 7,335,960 B2 | 2/2008 | Han et al. |
| 7,335,961 B2 | 2/2008 | Guo et al. |
| 7,345,911 B2 | 3/2008 | Min et al. |
| 7,351,594 B2 | 4/2008 | Bae et al. |
| 7,358,100 B2 | 4/2008 | Cao et al. |
| 7,394,122 B2 | 7/2008 | Min et al. |
| 7,394,123 B2 | 7/2008 | Min et al. |
| 7,426,097 B2 | 9/2008 | Drewes et al. |
| 7,446,987 B2 | 11/2008 | Zhang et al. |
| 7,449,345 B2 | 11/2008 | Horng et al. |
| 7,456,029 B2 | 11/2008 | Guo et al. |
| 7,466,583 B2 | 12/2008 | Min et al. |
| 7,476,919 B2 | 1/2009 | Hong et al. |
| 7,476,954 B2 | 1/2009 | Wang et al. |
| 7,479,394 B2 | 1/2009 | Horng et al. |
| 7,486,545 B2 | 2/2009 | Min et al. |
| 7,504,266 B2 | 3/2009 | Lee et al. |
| 7,515,388 B2 | 4/2009 | Zhang et al. |
| 7,528,457 B2 | 5/2009 | Horng et al. |
| 7,564,658 B2 | 7/2009 | Zhang et al. |
| 7,577,021 B2 | 8/2009 | Guo et al. |
| 7,582,942 B2 | 9/2009 | Guo et al. |
| 7,588,945 B2 | 9/2009 | Min et al. |
| 7,595,520 B2 | 9/2009 | Horng et al. |
| 7,602,590 B2 | 10/2009 | Zhao et al. |
| 7,611,912 B2 | 11/2009 | Hong et al. |
| 7,663,131 B2 | 2/2010 | Horng et al. |
| 7,696,551 B2 | 4/2010 | Xiao et al. |
| 7,742,261 B2 | 6/2010 | Zhao et al. |
| 7,760,544 B2 | 7/2010 | Guo et al. |
| 7,808,027 B2 | 10/2010 | Horng et al. |
| 7,829,963 B2 | 11/2010 | Wang et al. |
| 7,863,060 B2 | 1/2011 | Belen et al. |
| 7,884,403 B2 | 2/2011 | Yuasa |
| 7,897,412 B2 | 3/2011 | Park et al. |
| 7,936,027 B2 | 5/2011 | Xiao et al. |
| 7,948,044 B2 | 5/2011 | Horng et al. |
| 7,986,497 B2 | 7/2011 | Horng et al. |
| 7,989,224 B2 | 8/2011 | Gaidis |
| 7,994,596 B2 | 8/2011 | Min et al. |
| 7,999,360 B2 | 8/2011 | Hong et al. |
| 8,018,011 B2 | 9/2011 | Ranjan et al. |
| 8,039,885 B2 | 10/2011 | Wang et al. |
| 8,057,925 B2 | 11/2011 | Horng et al. |
| 8,062,909 B2 | 11/2011 | Wang et al. |
| 8,085,581 B2 | 12/2011 | Xia |
| 8,105,705 B2 | 1/2012 | Bai et al. |
| 8,120,949 B2 | 2/2012 | Ranjan et al. |
| 8,133,745 B2 | 3/2012 | Zhong et al. |
| 8,138,561 B2 | 3/2012 | Horng et al. |
| 8,138,562 B2 | 3/2012 | Mao |
| 8,169,816 B2 | 5/2012 | Min et al. |
| 8,178,363 B2 | 5/2012 | Wang et al. |
| 8,184,411 B2 | 5/2012 | Zhang et al. |
| 8,264,052 B2 | 9/2012 | Xia |
| 8,278,123 B2 | 10/2012 | Choi et al. |
| 8,319,263 B2 | 11/2012 | Yuasa |
| 8,324,697 B2 | 12/2012 | Worledge |
| 8,330,240 B2 | 12/2012 | Ranjan et al. |
| 8,372,661 B2 | 2/2013 | Horng et al. |
| 8,378,330 B2 | 2/2013 | Horng et al. |
| 8,404,367 B2 | 3/2013 | Horng et al. |
| 8,405,134 B2 | 3/2013 | Yuasa |
| 8,440,471 B2 | 5/2013 | Ranjan et al. |
| 8,456,883 B1 | 6/2013 | Liu |
| 8,456,893 B2 | 6/2013 | Horng et al. |
| 8,470,462 B2 | 6/2013 | Horng et al. |
| 8,477,530 B2 | 7/2013 | Ranjan et al. |
| 8,508,006 B2 | 8/2013 | Jan et al. |
| 8,514,524 B2 | 8/2013 | Wu et al. |
| 8,536,668 B2 | 9/2013 | Worledge |
| 8,541,855 B2 | 9/2013 | Jan et al. |
| 8,592,927 B2 | 11/2013 | Jan et al. |
| 8,609,262 B2 | 12/2013 | Horng et al. |
| 8,673,654 B2 | 3/2014 | Hong et al. |
| 8,698,260 B2 | 4/2014 | Jan et al. |
| 8,698,261 B2 | 4/2014 | Jan et al. |
| 8,710,603 B2 | 4/2014 | Jan et al. |
| 8,715,776 B2 | 5/2014 | Guo et al. |
| 8,722,543 B2 | 5/2014 | Belen et al. |
| 8,726,491 B2 | 5/2014 | Horng et al. |
| 8,728,333 B2 | 5/2014 | Wang et al. |
| 8,749,003 B2 | 6/2014 | Horng et al. |
| 8,822,234 B2 | 9/2014 | Wang et al. |
| 8,823,118 B2 | 9/2014 | Horng et al. |
| 8,852,760 B2 | 10/2014 | Wang et al. |
| 8,852,963 B2 | 10/2014 | Carey et al. |
| 8,860,156 B2 | 10/2014 | Beach et al. |
| 8,866,207 B2 | 10/2014 | Hu et al. |
| 8,878,323 B2 | 11/2014 | Jan et al. |
| 8,900,884 B2 | 12/2014 | Kula et al. |
| 8,921,961 B2 | 12/2014 | Kula et al. |
| 8,923,044 B2 | 12/2014 | Li et al. |
| 8,962,348 B2 | 2/2015 | Jan et al. |
| 8,981,503 B2 | 3/2015 | Beach et al. |
| 8,981,505 B2 | 3/2015 | Moriyama et al. |
| 8,987,847 B2 | 3/2015 | Jan et al. |
| 8,987,848 B2 | 3/2015 | Jan et al. |
| 8,987,849 B2 | 3/2015 | Jan et al. |
| 9,006,704 B2 | 4/2015 | Jan et al. |
| 9,006,849 B2 | 4/2015 | Guo |
| 9,024,399 B2 | 5/2015 | Guo |
| 2002/0084500 A1 | 7/2002 | Kang et al. |
| 2002/0109167 A1 | 8/2002 | Kang et al. |
| 2004/0101702 A1 | 5/2004 | Kim et al. |
| 2004/0196681 A1 | 10/2004 | Xiao et al. |
| 2006/0022286 A1 | 2/2006 | Leuschner et al. |
| 2006/0176735 A1 | 8/2006 | Yuasa |
| 2007/0080381 A1 | 4/2007 | Chien et al. |
| 2007/0154630 A1 | 7/2007 | Kim et al. |
| 2007/0253245 A1 | 11/2007 | Ranjan et al. |
| 2007/0258170 A1 | 11/2007 | Yuasa |
| 2008/0205130 A1 | 8/2008 | Sun et al. |
| 2008/0246104 A1 | 10/2008 | Ranjan et al. |
| 2010/0181632 A1 | 7/2010 | Yuasa |
| 2012/0146167 A1 | 6/2012 | Huai et al. |
| 2012/0241878 A1 | 9/2012 | Hu et al. |
| 2012/0267733 A1 | 10/2012 | Hu et al. |
| 2012/0280337 A1 | 11/2012 | Cao et al. |
| 2012/0280339 A1 | 11/2012 | Zhang et al. |
| 2013/0005052 A1 | 1/2013 | Hu et al. |
| 2013/0015539 A1 | 1/2013 | Choi |
| 2013/0071954 A1 | 3/2013 | Zhou et al. |
| 2013/0119498 A1 | 5/2013 | Huai et al. |
| 2013/0216702 A1 | 8/2013 | Kaiser et al. |
| 2013/0228883 A1 | 9/2013 | Yuasa |
| 2013/0258763 A1 | 10/2013 | Ranjan et al. |
| 2013/0309784 A1 | 11/2013 | Jan et al. |

(56) References Cited

U.S. PATENT DOCUMENTS

| | | |
|---|---|---|
| 2014/0008744 A1 | 1/2014 | Huai et al. |
| 2014/0042571 A1 | 2/2014 | Gan et al. |
| 2014/0099735 A1 | 4/2014 | Horng et al. |
| 2014/0103469 A1 | 4/2014 | Jan et al. |
| 2014/0151827 A1 | 6/2014 | Zhou et al. |
| 2014/0175578 A1 | 6/2014 | Chan et al. |
| 2014/0183608 A1 | 7/2014 | Gan et al. |
| 2014/0217487 A1 | 8/2014 | Guo |
| 2014/0306302 A1 | 10/2014 | Jan et al. |
| 2014/0319632 A1 | 10/2014 | Guo |
| 2014/0328116 A1 | 11/2014 | Guo |
| 2014/0365688 A1* | 12/2014 | Lee .................... H01L 43/08 710/7 |
| 2015/0001656 A1 | 1/2015 | Beach et al. |
| 2015/0008547 A1 | 1/2015 | Pi et al. |
| 2015/0008550 A1 | 1/2015 | Min et al. |
| 2015/0010780 A1 | 1/2015 | Carey et al. |
| 2015/0021675 A1 | 1/2015 | Min |
| 2015/0061055 A1 | 3/2015 | Jan et al. |
| 2015/0061056 A1 | 3/2015 | Jan et al. |
| 2015/0061057 A1 | 3/2015 | Jan et al. |
| 2015/0061058 A1 | 3/2015 | Jan et al. |
| 2015/0102438 A1 | 4/2015 | Gan et al. |
| 2015/0102441 A1 | 4/2015 | Gan et al. |
| 2015/0115379 A1 | 4/2015 | Lim et al. |
| 2015/0129993 A1 | 5/2015 | Tang et al. |
| 2015/0171315 A1* | 6/2015 | Gan .................. H01F 10/3286 257/421 |

* cited by examiner

SEMICONDUCTOR DEVICE HAVING MAGNETIC TUNNEL JUNCTION STRUCTURE AND METHOD OF FABRICATING THE SAME

CROSS-REFERENCE TO RELATED APPLICATION

This application claims priority under 35 U.S.C. § 119 to Korean Patent Application No. 10-2015-0132504 filed on Sep. 18, 2015, the disclosure of which is hereby incorporated by reference in its entirety.

BACKGROUND

Embodiments of the inventive concept relate to a semiconductor device in which a magnetic tunnel junction structure is disposed between a lower electrode and an upper electrode and a method of forming the same.

A semiconductor device, such as a magnetic memory device, includes a magnetic tunnel junction structure. The magnetic tunnel junction structure may include a pinned magnetic pattern, a tunnel barrier pattern, and a free magnetic pattern that are vertically stacked. To maintain a crystal lattice of the pinned magnetic pattern, the magnetic tunnel junction structure may further include a seed pattern disposed on the pinned magnetic pattern. In a semiconductor device that includes a magnetic tunnel junction structure, various approaches have been tried to prevent the materials forming the structures and/or elements that are adjacent to the pinned magnetic pattern to adversely affect formation of the pinned magnetic pattern.

SUMMARY

Embodiments of the inventive concept provide a semiconductor device that includes a magnetic tunnel junction structure that is capable of effectively preventing the lattice structure of elements and structures that are adjacent to a pinned magnetic pattern from adversely affecting the lattice structure of the pinned magnetic pattern and a method of forming the same.

Other embodiments of the inventive concept provide a semiconductor device capable of effectively preventing degradation of electromagnetic characteristics of a magnetic tunnel junction structure that may be caused by a lower electrode, and a method of forming the same.

The technical objectives of the inventive concept are not limited to the above disclosure; other objectives may become apparent to those of ordinary skill in the art based on the following descriptions.

A semiconductor device according to the embodiments of the inventive concept includes a seed pattern, a pinned magnetic pattern disposed on the seed pattern, a tunnel barrier pattern disposed on the pinned magnetic pattern, and a free magnetic pattern disposed on the tunnel barrier pattern. The seed pattern includes a first amorphous seed layer, and an oxidized seed layer disposed on a surface of the first amorphous seed layer.

A side surface of the oxidized seed layer may be substantially vertically aligned with a side surface of the first amorphous seed layer.

The oxidized seed layer may be disposed on the surface of the first amorphous seed layer proximate to the pinned magnetic pattern.

A vertical thickness of the oxidized seed layer may be less than a vertical thickness of the first amorphous seed layer in which the vertical thickness of the oxidized seed layer and the vertical thickness of the first amorphous see layer are in a direction that is substantially parallel to a direction between the seed pattern and the pinned magnetic layer.

The seed pattern may further include a second amorphous seed layer disposed between the first amorphous seed layer and the oxidized seed layer. A configuration of the second amorphous seed layer may be different from that of the first amorphous seed layer.

The materials that form the oxidized seed layer may include substantially all of the materials that form the second amorphous seed layer.

A side surface of the second amorphous seed layer may be vertically aligned with a side surface of the oxidized seed layer.

A vertical thickness of the second amorphous seed layer may be less than the vertical thickness of the first amorphous seed layer in which the vertical thickness of the oxidized seed layer and the vertical thickness of the first amorphous see layer are in a direction that is substantially parallel to a direction between the seed pattern and the pinned magnetic layer.

A semiconductor device according to the embodiments of the inventive concept includes a lower electrode and a magnetic tunnel junction structure including a seed pattern disposed on the lower electrode. The seed pattern includes an oxidized seed layer.

The magnetic tunnel junction structure may further include a pinned magnetic pattern disposed on the seed pattern, a free magnetic pattern disposed on the pinned magnetic pattern, and a tunnel barrier pattern disposed between the pinned magnetic pattern and the free magnetic pattern. A vertical thickness of the oxidized seed layer may be less than a vertical thickness of the tunnel barrier pattern in which the vertical thickness of the oxidized seed layer and the vertical thickness of the tunnel barrier layer are in a direction that is substantially parallel to a direction between the lower electrode and the free magnetic pattern.

The seed pattern may further include an intermediate amorphous seed layer, and a crystalline seed layer disposed on the intermediate amorphous seed layer. The oxidized seed layer is disposed between the lower electrode and the intermediate amorphous seed layer.

A side surface of the oxidized seed layer may be substantially vertically aligned with a side surface of the crystalline seed layer.

The seed pattern may further include a lower amorphous seed layer disposed between the lower electrode and the oxidized seed layer. The oxidized seed layer may include substantially all materials that form the lower amorphous seed layer.

The lower amorphous seed layer may have a configuration that is different from a configuration of the intermediate amorphous seed layer.

A vertical thickness of the lower amorphous seed layer may be less than a vertical thickness of the intermediate amorphous seed layer in which the vertical thickness of the lower amorphous seed layer and the vertical thickness of the intermediate amorphous seed layer are in a direction that is substantially parallel to a direction between the lower electrode and the intermediate amorphous seed layer.

The seed pattern may further include an upper amorphous seed layer disposed between the intermediate amorphous seed layer and the crystalline seed layer. A configuration of the upper amorphous seed layer may be different from a configuration of the intermediate amorphous seed layer.

A vertical thickness of the upper amorphous seed layer may be less than the vertical thickness of the intermediate amorphous seed layer in which the vertical thickness of the upper amorphous seed layer and the vertical thickness of the intermediate amorphous seed layer are in a direction that is substantially parallel to a direction between the lower electrode and the intermediate amorphous seed layer.

A semiconductor device according to the embodiments of the inventive concept includes a lower electrode, an amorphous seed layer disposed on the lower electrode, an oxidized seed layer disposed on the amorphous seed layer, a crystalline seed layer disposed on the oxidized seed layer, a pinned magnetic pattern disposed on the crystalline seed layer, a tunnel barrier pattern disposed on the pinned magnetic pattern, and a free magnetic pattern disposed on the tunnel barrier pattern.

The pinned magnetic pattern may include a lower pinned magnetic layer disposed in close proximity to the crystalline seed layer, an upper pinned magnetic layer disposed in close proximity to the tunnel barrier pattern, and a spacer disposed between the lower pinned magnetic layer and the upper pinned magnetic layer. A vertical thickness of the oxidized seed layer may be smaller than a vertical thickness of the spacer in which a vertical thickness of the oxidized seed layer and the vertical thickness of the spacer are in a direction that is parallel to a direction between the lower electrode and the free magnetic pattern.

A semiconductor device according to embodiments of the inventive concept comprises: a seed layer comprising a first layer and a second layer, the first layer comprising a first lattice structure and the second layer comprising a second lattice structure that is different from the first lattice structure; a pinned magnetic layer on the second layer of the seed layer; a tunnel barrier layer on the pinned magnetic layer; and a free magnetic layer on the tunnel barrier pattern. The first layer may comprise an amorphous lattice structure, and the second layer may comprises a crystalline lattice structure.

The seed layer may further comprise a third layer between the first layer and the second layer in which a lattice structure of the third layer comprises an oxidized lattice structure of the amorphous lattice structure of the first layer.

The third layer may comprise an oxidized material of Ta or B. The third layer may comprises a thickness of less than about 4 Å in which the thickness of the third layer is in a direction that is substantially parallel to a direction between the seed layer and the free magnetic layer.

The semiconductor device may further comprise a lower electrode in which the first layer of the seed layer may be on the lower electrode.

The semiconductor device may further comprise an upper electrode on the free magnetic layer.

The semiconductor device may further comprise a capping layer and a hard mask layer between the free magnetic layer and the upper electrode.

A method to form a semiconductor device according to embodiments of the inventive concept comprises: forming a seed layer comprising a first layer and a second layer in which the first layer comprises a first lattice structure and the second layer comprises a second lattice structure that is different from the first lattice structure; forming a pinned magnetic layer on the second layer of the seed layer; forming a tunnel barrier layer on the pinned magnetic layer; and forming a free magnetic layer on the tunnel barrier pattern. The first layer may comprise an amorphous lattice structure, and the second layer may comprise a crystalline lattice structure.

Forming the seed layer may further comprise forming the seed layer comprising a first layer, a second layer and a third layer in which the first layer may comprises a first lattice structure, the second layer may comprising a second lattice structure that is different from the first lattice structure, the third layer may be formed between the first layer and the second layer, and in which a lattice structure of the third layer may comprises an oxidized lattice structure of the amorphous lattice structure of the first layer. The third layer may comprise an oxidized material of Ta or B. The third layer may comprise a thickness of less than about 4 Å in which the thickness of the third layer is in a direction that is substantially parallel to a direction between the seed layer and the free magnetic layer.

The method may further comprise forming a lower electrode in which the first layer of the seed layer is formed on the lower electrode.

The method may further comprise forming an upper electrode on the free magnetic layer.

Details of other embodiments are included in the detailed description and drawings.

BRIEF DESCRIPTION OF THE DRAWINGS

The foregoing and other features and advantages of the inventive concepts will be apparent from the more particular description of embodiments of the inventive concepts, as illustrated in the accompanying drawings in which like reference numerals denote the same respective parts throughout the different views. The drawings are not necessarily to scale with the emphasis instead being placed upon illustrating the principles of the inventive concepts. In the drawings.

DETAILED DESCRIPTION OF THE EMBODIMENTS

Figure 1:
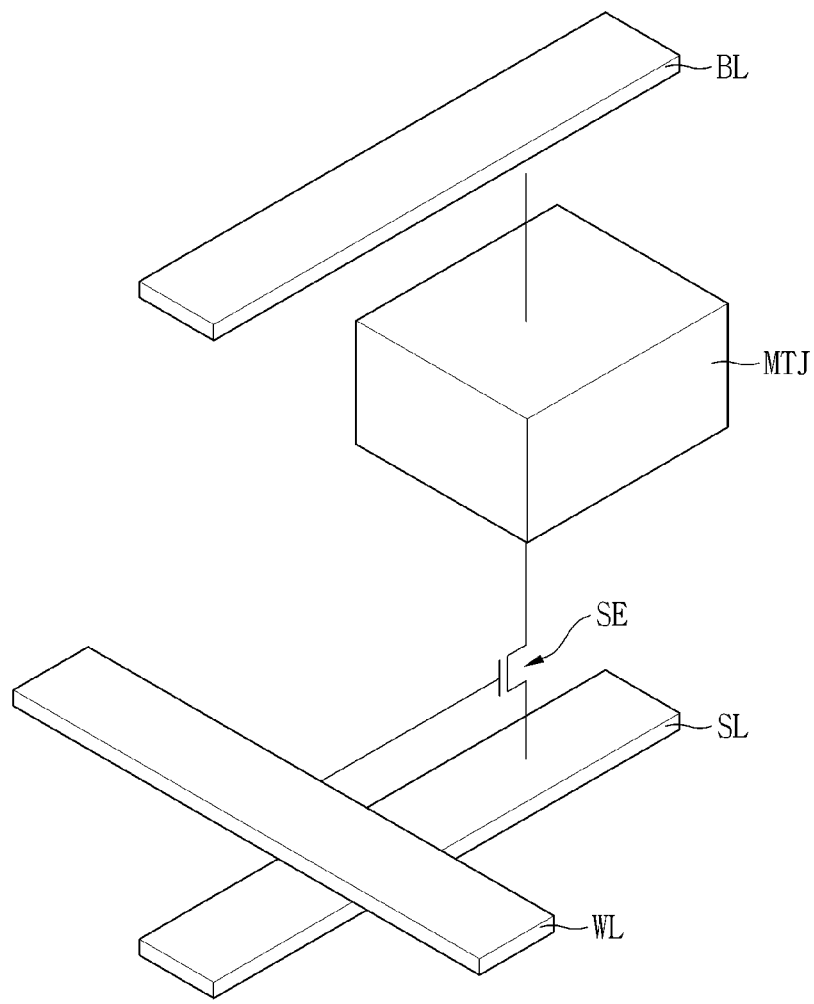
FIG. 1 is a schematic view illustrating a semiconductor device according to an embodiment of the inventive concept.

Particular structural and functional descriptions regarding embodiments of the inventive concept set forth herein are described in simple terms to explain these embodiments. The embodiments disclosed herein are provided so that this disclosure is thorough, complete and fully conveys the inventive concept to those skilled in the art. Accordingly, the inventive concept may be accomplished in other various embodiments that are not described herein and, consequently, the present disclosure should not be construed as limited to the embodiments as set forth herein.

Like numerals refer to like elements throughout the specification. In the drawings, the lengths and thicknesses of layers and regions may be exaggerated for clarity. In addition, it will be understood that when a first element is referred to as being "on" a second element, the first element may be directly on the second element, or a third element may be interposed between the first element and the second element. Additionally, as indicated in several of the drawings, an X axis is oriented in a direction that extends out of the plane of the drawing; a Y axis is oriented in a direction that extends horizontally in the plane of the drawing; and a Z axis is oriented is a direction that extends vertically in the plane of the drawing.

It will be understood that, although the terms "first," "second," "third," etc. may be used herein to describe various elements, components, regions, layers, and/or sections, these elements, components, regions, layers, and/or sections should not be limited by such terms. Such terms are only used to distinguish one element, component, region, layer, or section from another region, layer, or section. Thus, a first element, component, region, layer or section discussed below could be termed a second element, component, region, layer or section without departing from the teachings of the present inventive concept.

The terminology used here is for describing particular example embodiments only and is not intended to be limiting. As used here, the singular forms "a," "an," and "the" are intended to include plural forms as well unless the context clearly indicates otherwise. It will be further understood that the terms "comprises," "comprising," "includes," and/or "including" when used in this specification, specify the presence of stated features, integers, steps, operations, elements, and/or components, but do not preclude the presence or addition of one or more other features, integers, steps, operations, elements, and/or components.

Unless otherwise defined, all terms (including technical and scientific terms) used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and will not be interpreted in an idealized or overly formal sense unless expressly defined herein.

Embodiments

FIG. 1 is a schematic view depicting a semiconductor device according to an embodiment of the inventive concept.

Referring to FIG. 1, the semiconductor device according to an embodiment may include a word line WL, a bit line BL, a source line SL, a switching element SE, and a magnetic tunnel junction element MTJ.

The word line WL and the bit line BL may each extend in different directions. For example, the word line WL may intersect the bit line BL when viewed in a plan view. The source line SL may be applied with a common voltage. For example, the source line SL may intersect the word line WL when viewed in a plan view.

The switching element SE may be disposed between the source line SL and the magnetic tunnel junction element MTJ. The switching element SE may be controlled by an electrical signal applied to the word line WL. For example, the switching element SE may be a transistor including a gate electrically connected to the word line WL.

The magnetic tunnel junction element MTJ may be disposed between the switching element SE and the bit line BL. The magnetic tunnel junction element MTJ may have a resistance value that is changed by an electrical signal applied through the word line WL and an electrical signal applied through the bit line BL.

Figure 2:
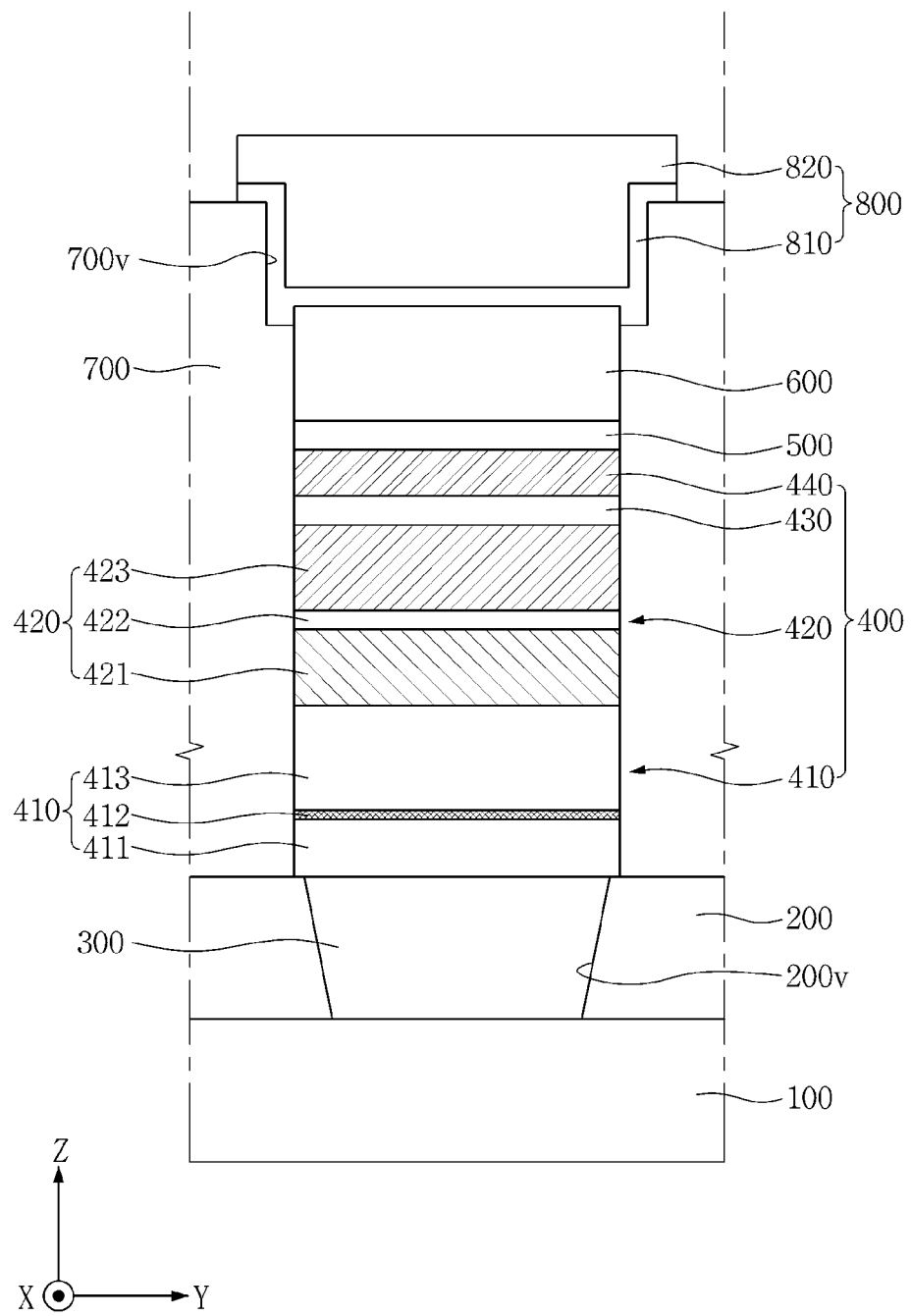
FIG. 2 is a view illustrating a magnetic tunnel junction element of the semiconductor device according to the embodiment of the inventive concept.

FIG. 2 is a schematic view showing a magnetic tunnel junction element of the semiconductor device illustrated in FIG. 1.

Referring to FIG. 2, the magnetic tunnel junction element of the semiconductor device according to an embodiment may include a substrate 100, a lower interlayer insulating layer 200, a lower electrode 300, a magnetic tunnel junction structure 400, a capping pattern 500, a hard mask pattern 600, an upper interlayer insulating layer 700, and an upper electrode 800.

The substrate 100 may be formed from a semiconductor wafer. For example, the substrate 100 may be formed from a crystal silicon wafer or a silicon on insulator (SOI) wafer.

The lower interlayer insulating layer 200 may be disposed on the substrate 100. The word line WL, the source line SL, and the switching element SE, which are depicted in FIG. 1, may be disposed between the substrate 100 and the lower interlayer insulating layer 200.

The lower interlayer insulating layer 200 may include an insulating material. For example, the lower interlayer insulating layer 200 may include silicon oxide and/or silicon nitride. The lower interlayer insulating layer 200 may have a multilayer structure.

The lower interlayer insulating layer 200 may include a lower via hole 200v. The lower via hole 200v may pass through the lower interlayer insulating layer 200. For example, an electrode of the switching element SE depicted in FIG. 1 may be exposed by the lower via hole 200v.

The lower electrode 300 may be electrically connected to the switching element SE depicted in FIG. 1. For example, the lower electrode 300 may be disposed inside the lower via hole 200v of the lower interlayer insulating layer 200. A level of an upper surface of the lower electrode 300 may be the same or substantially the same as a level of an upper surface of the lower interlayer insulating layer 200.

The lower electrode 300 may include a conductive material. For example, the lower electrode 300 may include a metal, such as Cu, W or Ti.

The magnetic tunnel junction structure 400 may be disposed on the lower electrode 300. For example, a horizontal width of the magnetic tunnel junction structure 400 (i.e., in a direction that is parallel to the Y-axis in FIG. 2) may be greater than or equal to the horizontal width that of the upper surface of the lower electrode 300. The upper surface of the lower electrode 300 may be completely covered by the magnetic tunnel junction structure 400.

In the semiconductor device according to an embodiment, the horizontal width of the magnetic tunnel junction structure (i.e., in a direction that is substantially parallel to the Y axis in FIG. 2) is described herein as being greater than or equal to the horizontal width of the upper surface of the lower electrode. However, in a semiconductor device according to another embodiment, a horizontal width of a magnetic tunnel junction structure (i.e., in a direction that is substantially parallel to the Y-axis in FIG. 2) may be less than that of an upper surface of a lower electrode.

In the semiconductor device according to an embodiment, the upper surface of the lower electrode is described herein as being completely covered by the magnetic tunnel junction structure. However, in a semiconductor device according to another embodiment, a magnetic tunnel junction structure may only partially cover an upper surface of a lower electrode.

The magnetic tunnel junction structure 400 may include a seed pattern 410, a pinned magnetic pattern 420, a tunnel barrier pattern 430, and a free magnetic pattern 440.

The seed pattern 410 may prevent the lower electrode 300 from adversely affecting formation of the pinned magnetic pattern 420. In particular, the seed pattern 410 may prevent a crystal structure of the lower electrode 300 from being transferred to the pinned magnetic pattern 420. The seed pattern 410 may be disposed in close proximity to the lower electrode 300. That is, the seed pattern 410 may be disposed in direct contact with the lower electrode 300.

The seed pattern 410 may include an amorphous seed layer 411, an oxidized seed layer 412 and a crystalline seed layer 413.

The amorphous seed layer 411 may be disposed in close proximity to the lower electrode 300. For example, the amorphous seed layer 411 may be in direct contact with an upper surface of the lower electrode 300.

The amorphous seed layer 411 may be formed to be in an amorphous state. The amorphous seed layer 411 may include an amorphization material. That is, the amorphous seed layer 411 may include a material for maintains the amorphous seed layer 411 in an amorphous state. For example, the amorphous seed layer 411 may include B, P, As or Bi. The amorphous seed layer 411 may include a conductive material. For example, the amorphous seed layer 411 may include CFBTa.

The oxidized seed layer 412 may be disposed on the amorphous seed layer 411. The oxidized seed layer 412 may be in direct contact with an upper surface of the amorphous seed layer 411. A side surface of the amorphous seed layer 411 may, for example, be vertically aligned or substantially vertically aligned with a side surface of the oxidized seed layer 412.

The oxidized seed layer 412 may include an oxide. For example, the oxidized seed layer 412 may include an oxidized conductive material. The oxidized seed layer 412 may have a different lattice configuration from the amorphous lattice configuration of the amorphous seed layer 411. That is, the oxidized seed layer 412 may include an oxide only from materials that form the amorphous seed layer 411. For example, the oxidized seed layer 412 may include an oxidized material of Ta and/or B.

The crystalline seed layer 413 may be disposed on the oxidized seed layer 412. The crystalline seed layer 413 may be in direct contact with an upper surface of the oxidized seed layer 412. A side surface of the oxidized seed layer 412 may, for example, be vertically aligned or substantially vertically aligned with a side surface of the crystalline seed layer 413.

The crystalline seed layer 413 may be formed to be in a crystalline state. The crystalline seed layer 413 may include a conductive material. The crystalline seed layer 413 may include materials that are different from the materials of the amorphous seed layer 411 and the oxidized seed layer 412. For example, the crystalline seed layer 413 may include Ru.

In the magnetic tunnel junction element of the semiconductor device according to an embodiment, the seed pattern 410 may include the oxidized seed layer 412, which is an insulating material. Therefore, as a vertical thickness of the oxidized seed layer 412 increases in a direction that is substantially parallel to the Z-axis shown in FIG. 2, the overall resistance of the magnetic tunnel junction may correspondingly increase. Thus, the vertical thickness of the oxidized seed layer 412 may be relatively smaller than the vertical thickness of different elements forming the semiconductor device of FIG. 2. For example, in the magnetic tunnel junction element of the semiconductor device according to an embodiment, the oxidized seed layer 412 may have a vertical thickness that is less than 4 Å.

The pinned magnetic pattern 420 may be disposed on the seed pattern 410. The pinned magnetic pattern 420 may be in direct contact with an upper surface of the seed pattern 410. A side surface of the seed pattern 410 may, for example, be vertically aligned or substantially vertically aligned with a side surface of the pinned magnetic pattern 420.

The pinned magnetic pattern 420 may include a synthetic anti-ferromagnetic (SAF) structure. For example, the pinned magnetic pattern 420 may include a lower pinned magnetic layer 421, a spacer 422 and an upper pinned magnetic layer 423.

The lower pinned magnetic layer 421 may be disposed in close proximity to the seed pattern 410. For example, the lower pinned magnetic layer 421 may be in direct contact with an upper surface of the crystalline seed layer 413. The side surface of the crystalline seed layer 413 may, for example, be vertically aligned or substantially vertically aligned with a side surface of the lower pinned magnetic layer 421.

The lower pinned magnetic layer 421 may include a magnetic material. The lower pinned magnetic layer 421 may have a vertical magnetization characteristic. A magnetization direction of the lower pinned magnetic layer 421 may be perpendicular to a surface of the substrate 100 (i.e., in a direction that is substantially parallel to the Z-axis shown in FIG. 2). For example, the lower pinned magnetic layer 421 may include at least one of Co, Fe and Ni, and one of Pt, Pd, Ru and Ta.

The magnetization direction of the lower pinned magnetic layer 421 may be fixed, and the magnetization direction of the lower pinned magnetic layer 421 may not be affected by a magnetic field that is generated externally from the lower pinned magnetic layer 421. For example, the magnetization direction of the lower pinned magnetic layer 421 may not be changed by a magnetic field that may be formed between the lower electrode 300 and the upper electrode 800.

The spacer 422 may be disposed on the lower pinned magnetic layer 421. The spacer 422 may be in direct contact with an upper surface of the lower pinned magnetic layer 421. The side surface of the lower pinned magnetic layer 421 may, for example, be vertically aligned or substantially vertically aligned with a side surface of the spacer 422.

The spacer 422 may include a non-magnetic material. For example, the spacer 422 may include Ru, Ir, Re or Os.

A vertical thickness of the spacer 422 in a direction that is substantially parallel to the Z axis in FIG. 2 may be less than a vertical thickness of the lower pinned magnetic layer 421. The vertical thickness of the oxidized seed layer 412 in a direction that is substantially parallel to the Z axis in FIG. 2 may be less than the vertical thickness of the spacer 422.

The upper pinned magnetic layer 423 may be disposed on the spacer 422. The upper pinned magnetic layer 423 may be in direct contact with an upper surface of the spacer 422. the vertical thickness side surface of the spacer 422 may, for example, be vertically aligned or substantially vertically aligned with a side surface of the upper pinned magnetic layer 423.

The upper pinned magnetic layer 423 may include a magnetic material. The upper pinned magnetic layer 423 may have a vertical magnetization characteristic. The upper pinned magnetic layer 423 may further include an amorphization material. That is, upper pinned magnetic layer 423 may include a material for maintains the upper pinned magnetic layer 423 in an amorphous state. For example, the upper pinned magnetic layer 423 may include at least one of Co, Fe and Ni, at least one of Pt, Pd, Ru and Ta, and at least one of B, P, As and Bi.

A magnetization direction of the upper pinned magnetic layer 423 may be fixed. For example, the magnetization direction of the upper pinned magnetic layer 423 may not be changed by a magnetic field that may be formed between the lower electrode 300 and the upper electrode 800.

The tunnel barrier pattern 430 may be disposed on the pinned magnetic pattern 420. For example, the tunnel barrier pattern 430 may be in direct contact with an upper surface of the upper pinned magnetic layer 423. The side surface of the upper pinned magnetic layer 423 may, for example, be vertically aligned or substantially vertically aligned with a side surface of the tunnel barrier pattern 430.

The tunnel barrier pattern 430 may include a non-magnetic material. For example, the tunnel barrier pattern 430 may include MgO.

A vertical thickness of the tunnel barrier pattern 430 in a direction that is substantially parallel to the Z axis in FIG. 2 may be less than a vertical thickness of the pinned magnetic pattern 420. The vertical thickness of the tunnel barrier pattern 430 in the direction that is substantially parallel to the Z-axis in FIG. 2 may be greater than the vertical thickness of the spacer 422. The vertical thickness of the oxidized seed layer 412 may be less than the vertical thickness of the tunnel barrier pattern 430.

The free magnetic pattern 440 may be disposed on the tunnel barrier pattern 430. The free magnetic pattern 440 may be in direct contact with an upper surface of the tunnel barrier pattern 430. The side surface of the tunnel barrier pattern 430 may, for example, be vertically aligned or substantially vertically aligned with a side surface of the free magnetic pattern 440.

The free magnetic pattern 440 may include a magnetic material. The free magnetic pattern 440 may have a vertical magnetization characteristic. The free magnetic pattern 440 may further include an amorphization material. That is, free magnetic pattern 440 may include a material for maintains the free magnetic pattern 440 in an amorphous state. For example, the free magnetic pattern 440 may include at least one of Co, Fe and Ni, at least one of Pt, Pd, Ru and Ta, and at least one of B, P, As and Bi.

A magnetization direction of the free magnetic pattern 440 may be changed by a magnetic field that is generated externally from the free magnetic pattern 440. For example, the magnetization direction of the free magnetic pattern 440 may be changed by a magnetic field that may be formed between the lower electrode 300 and the upper electrode 800. A resistance value of the magnetic tunnel junction element of the semiconductor device according to an embodiment may be changed based on the magnetization direction of the free magnetic pattern 440.

The capping pattern 500 may be disposed on the magnetic tunnel junction structure 400. For example, the capping pattern 500 may be in direct contact with an upper surface of the free magnetic pattern 440. The side surface of the free magnetic pattern 440 may, for example, be vertically aligned or substantially vertically aligned with a side surface of the capping pattern 500.

The capping pattern 500 may include a conductive material. For example, the capping pattern 500 may include at least one of Cu, Ta, Al, Au, Ti, TiN and TaN. The capping pattern 500 may have a multilayer structure.

The hard mask pattern 600 may be disposed on the capping pattern 500. The hard mask pattern 600 may be in direct contact with an upper surface of the capping pattern 500. The side surface of the capping pattern 500 may, for example, be vertically aligned or substantially vertically aligned with a side surface of the hard mask pattern 600.

The hard mask pattern 600 may include a conductive material. The hard mask pattern 600 may include a material having a physical strength that is greater than a predetermined value. For example, the hard mask pattern 600 may include a metal, such as tungsten (W).

The upper interlayer insulating layer 700 may be disposed on the lower interlayer insulating layer 200. An upper surface of the upper interlayer insulating layer 700 may be higher than an upper surface of the hard mask pattern 600. That is, the upper surface of the upper interlayer insulating layer 700 may be higher in the Z-axis direction than an upper surface of the hard mask pattern 600. The magnetic tunnel junction structure 400, the capping pattern 500, and the hard mask pattern 600 may, for example, be surrounded by the upper interlayer insulating layer 700.

The upper interlayer insulating layer 700 may include an insulating material. For example, the upper interlayer insulating layer 700 may include silicon oxide.

The upper interlayer insulating layer 700 may include an upper via hole 700v. The upper surface of the hard mask pattern 600 may be exposed by the upper via hole 700v. For example, a horizontal width of a bottom surface of the upper via hole 700v in a direction that is substantially parallel to the Y axis in FIG. 2 may be greater than a horizontal width of the upper surface of the hard mask pattern 600. A level of the bottom surface of the upper via hole 700v may be lower in a direction that is substantially parallel to the Z axis in FIG. 2 than that of an upper surface of the hard mask pattern 600.

The upper electrode 800 may be electrically connected to the bit line BL depicted in FIG. 1. The upper electrode 800 may be disposed on the hard mask pattern 600. For example, the upper electrode 800 may be disposed inside the upper via hole 700v.

A level of an upper surface of the upper electrode 800 may be higher in a direction that is substantially parallel to the Z-axis in FIG. 2 than that of the upper surface of the upper interlayer insulating layer 700. For example, the upper electrode 800 may extend onto an upper surface of the upper interlayer insulating layer 700.

The upper electrode 800 may include an upper barrier pattern 810 and an upper conductive pattern 820. For example, the upper barrier pattern 810 may be disposed between the upper interlayer insulating layer 700 and the upper conductive pattern 820. The upper barrier pattern 810 may be in direct contact with the hard mask pattern 600 that has been exposed by the upper via hole 700v.

The upper barrier pattern 810 and the upper conductive pattern 820 may include a conductive material. For example, the upper barrier pattern 810 may include a metal nitride, and the upper conductive pattern 820 may include a metal.

The magnetic tunnel junction element of the semiconductor device according to the embodiment may include a seed pattern having an amorphous seed layer that is in an amorphous state, a crystalline seed layer that is in a crystalline state, and an oxidized seed layer that is disposed between the amorphous seed layer and the crystalline seed layer. Therefore, in the magnetic tunnel junction element of the semiconductor device according to an embodiment, a crystalline structure of the lower electrode may be prevented from adversely affecting the formation of the crystalline structure of a pinned magnetic pattern by the amorphous seed layer and the oxidized seed layer.

Figure 3:
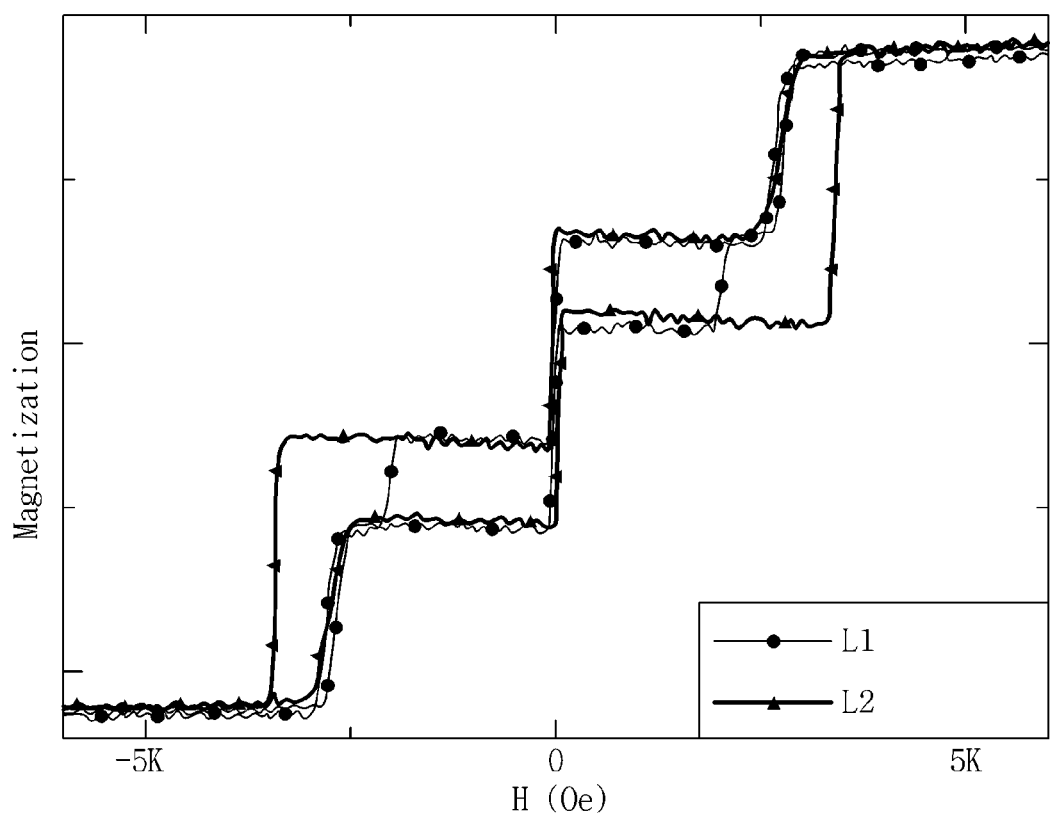
FIG. 3 is a graph showing changes in magnetization of magnetic tunnel junction assemblies based on an external magnetic field.

FIG. 3 is a graph showing changes in magnetization of a first magnetic tunnel junction element L1 in which a seed pattern does not include an oxidized seed layer in comparison to a second magnetic tunnel junction element L2 in which a seed pattern includes an oxidized seed layer by an external magnetic field. Here, a vertical axis in FIG. 3 represents a normalized magnetization value and detailed numerical values are not shown and/or described.

Referring to FIG. 3, as shown toward the center region of the graph, it may be seen that changes in magnetization of a free magnetic pattern in the first magnetic tunnel junction element L1 and the second magnetic tunnel junction element L2 have little differences. As shown toward the left and right sides of the graph, however, changes in magnetization of a lower pinned magnetic layer and an upper pinned magnetic layer in the first magnetic tunnel junction element L1 and the second magnetic tunnel junction element L2 have large differences. More specifically, it may be seen that the changes in magnetization of the lower pinned magnetic layer and the upper pinned magnetic layer in the second magnetic tunnel junction element L2 occur in a greater external magnetic field as compared to the first magnetic tunnel junction element L1.

Changes in magnetization of the lower pinned magnetic layer and the upper pinned magnetic layer that occur in a greater external magnetic field means that the pinned magnetic pattern, which includes the lower pinned magnetic layer and the upper pinned magnetic layer, has a relatively high coercivity and, therefore, is relatively stable. That is, in the graph of FIG. 3, it can be seen that the pinned magnetic pattern of the second magnetic tunnel junction element L2 provides a greater stability in comparison to the first magnetic tunnel junction element L1.

Consequentially, in the magnetic tunnel junction element of the semiconductor according to an embodiment, the seed pattern that is disposed between the lower electrode and the pinned magnetic pattern and that includes an amorphous seed layer and an oxidized seed layer may prevent a crystalline lattice structure a lower electrode from adversely affecting the crystalline lattice structure of the pinned magnetic pattern. Therefore, in the magnetic tunnel junction element of the semiconductor according to an embodiment, degradation of the electromagnetic characteristics of the magnetic tunnel junction structure caused by the lower electrode may be effectively be prevented.

Figure 4:
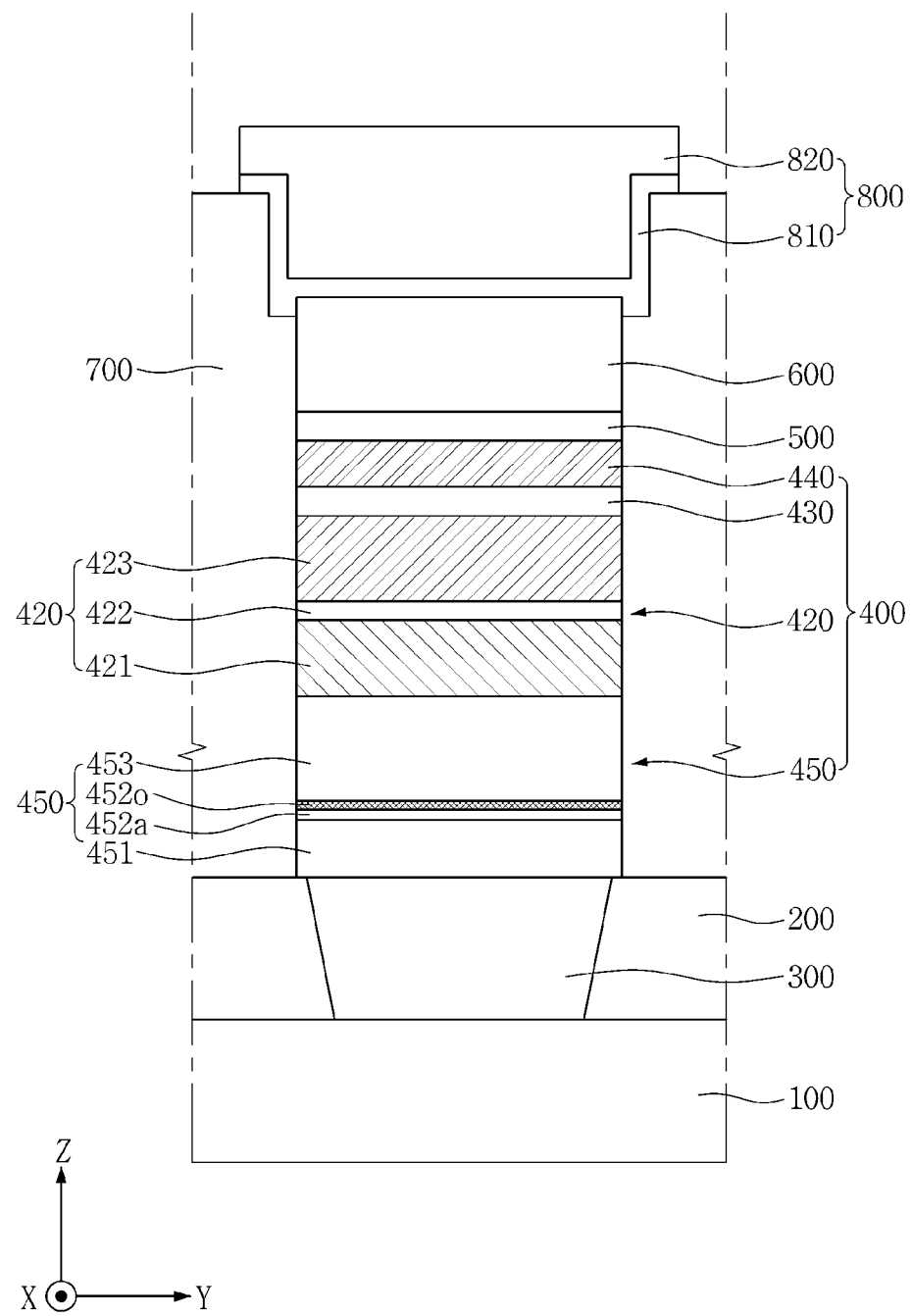
FIGS. 4 to 8 are respective views showing magnetic tunnel junction elements of semiconductor devices according to other embodiments of the inventive concept.

In the magnetic tunnel junction element of the semiconductor device according to an embodiment, the oxidized seed layer 412 may be described as being in direct contact with the amorphous seed layer 411 and the crystalline seed layer 413. In a magnetic tunnel junction element of a semiconductor device according to another embodiment that is shown in FIG. 4, a seed pattern 450 may, however, include a first amorphous seed layer 451, a second amorphous seed layer 452a that is disposed on the first amorphous seed layer 451, an oxidized seed layer 452o that is disposed on the second amorphous seed layer 452a and a crystalline seed layer 453 that is disposed on the oxidized seed layer 452o.

That is, a configuration of the second amorphous seed layer 452a may be different from that of the first amorphous seed layer 451. For example, the second amorphous seed layer 452a may include only some of the materials that form the first amorphous seed layer 451.

The oxidized seed layer 452o may include all of the materials that form the second amorphous seed layer 452a. For example, the oxidized seed layer 452o may be formed by oxidizing the surface of the second amorphous seed layer 452a using an oxidation process.

Figure 5:
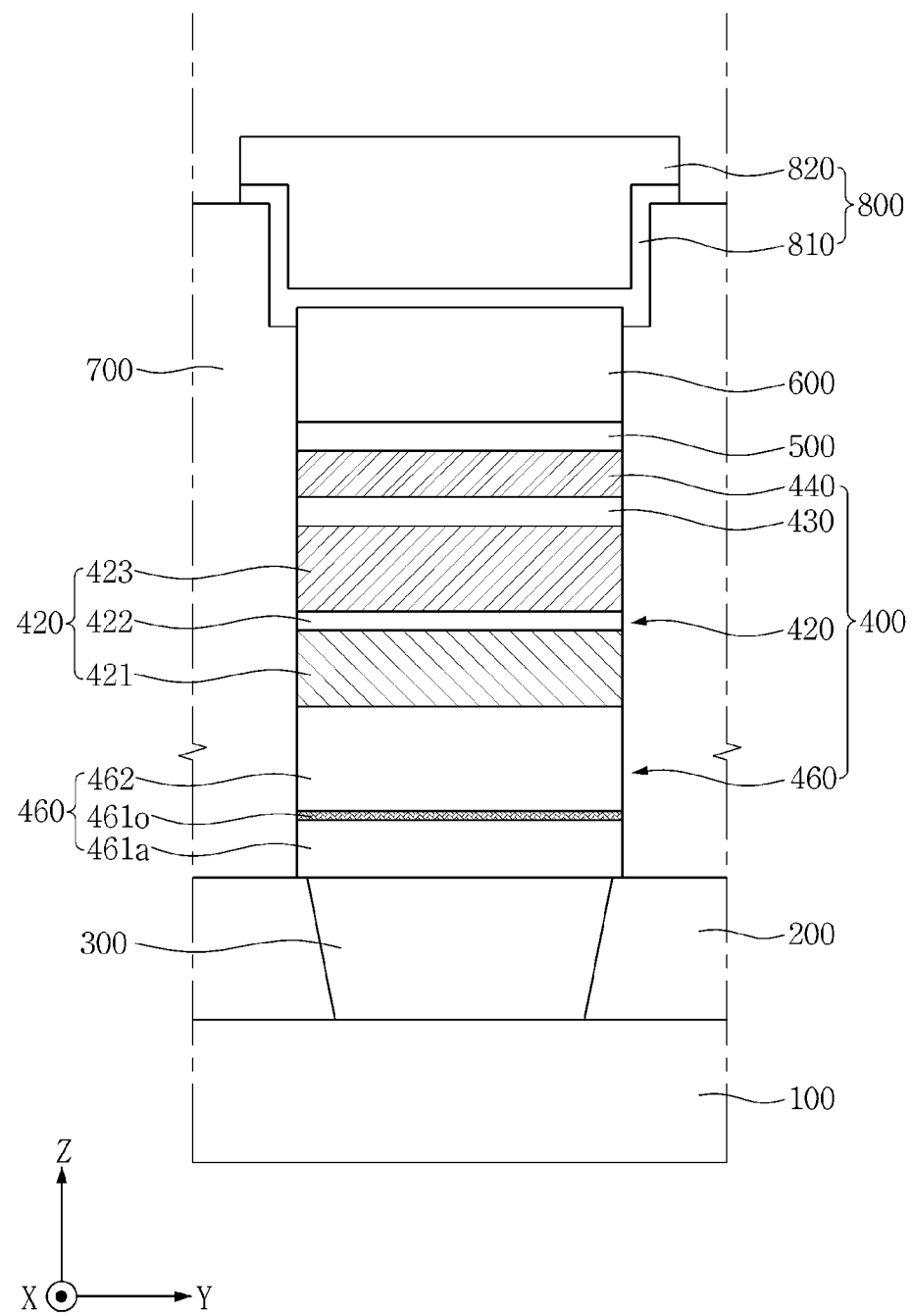

In the magnetic tunnel junction element of the semiconductor device according to an embodiment, the oxidized seed layer 412 may have a configuration that is different from a case in which the amorphous seed layer 411 is oxidized. A magnetic tunnel junction element of a semiconductor device according to another embodiment that is shown in FIG. 5 may, however, include a seed pattern 460 that includes an amorphous seed layer 461a, a crystalline seed layer 462 that is disposed on the amorphous seed layer 461a, and an oxidized seed layer 461o that is disposed between the amorphous seed layer 461a, and the crystalline seed layer 462. The crystalline seed layer 462 may include an oxide of all materials in the amorphous seed layer 461a.

Figure 6:
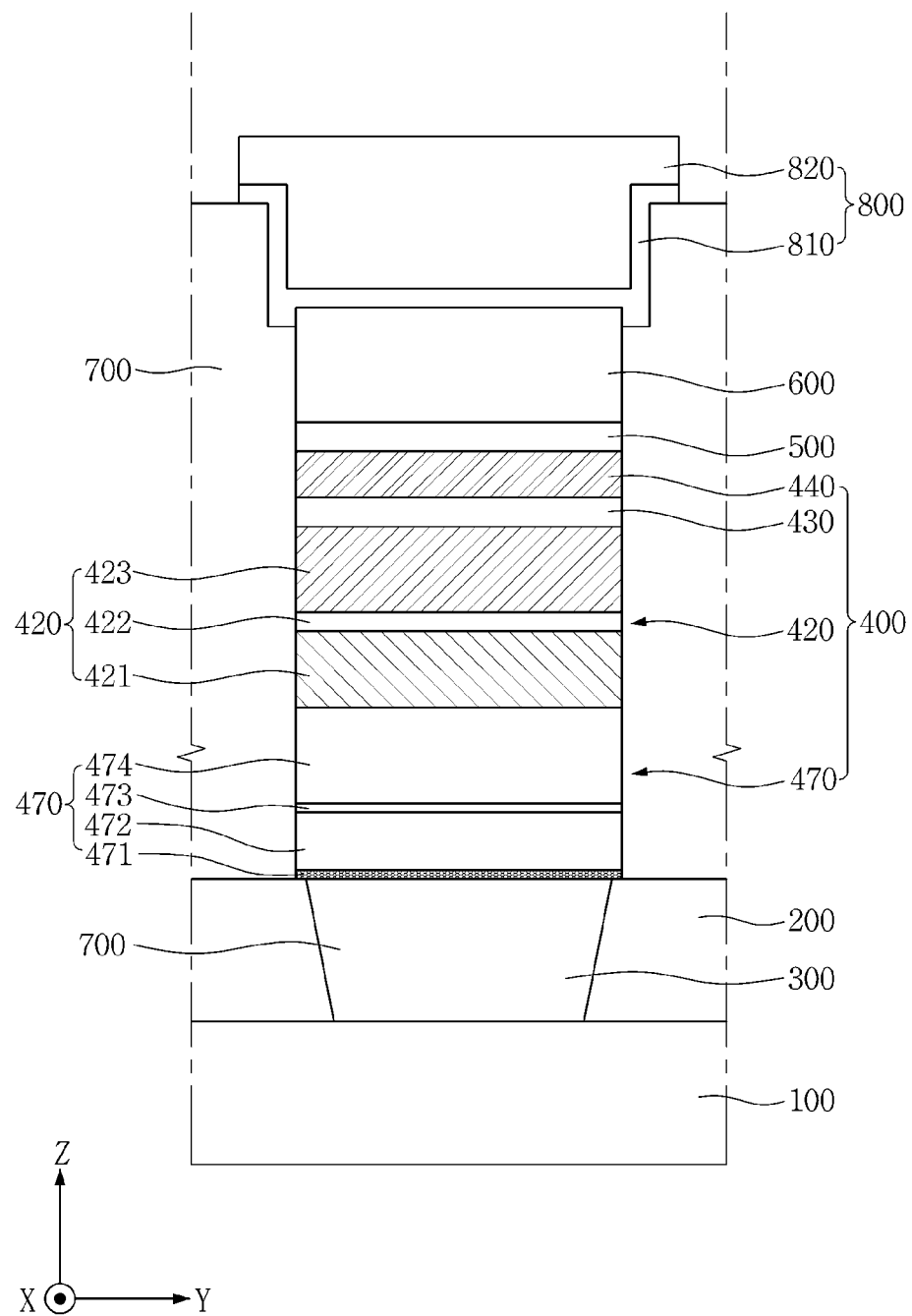

FIG. 6 is a view illustrating a magnetic tunnel junction element of a semiconductor device according to another embodiment of the inventive concept.

Referring to FIG. 6, the magnetic tunnel junction element of the semiconductor device according to an embodiment may include a substrate 100, a lower interlayer insulating layer 200, a lower electrode 300, a magnetic tunnel junction structure 400, a capping pattern 500, a hard mask pattern 600, an upper interlayer insulating layer 700, and an upper electrode 800.

The magnetic tunnel junction structure 400 may include a pinned magnetic pattern 420, a tunnel barrier pattern 430, a free magnetic pattern 440 and a seed pattern 470. The seed pattern 470 may be disposed between the lower electrode 300 and the pinned magnetic pattern 420. For example, the seed pattern 470 may include an oxidized seed layer 471, an intermediate amorphous seed layer 472, an upper amorphous seed layer 473 and a crystalline seed layer 474.

The oxidized seed layer 471 may be disposed in close proximity to the lower electrode 300. For example, the oxidized seed layer 471 may be in direct contact with the upper surface of the lower electrode 300.

The intermediate amorphous seed layer 472 may be disposed on the oxidized seed layer 471. The intermediate amorphous seed layer 472 may be in direct contact with an upper surface of the oxidized seed layer 471. A side surface of the oxidized seed layer 471 may, for example, be vertically aligned or substantially vertically aligned with a side surface of the intermediate amorphous seed layer 472.

The oxidized seed layer 471 may have a different configuration from the configuration in which the intermediate amorphous seed layer 472 is oxidized. For example, the oxidized seed layer 471 may not include an oxide of materials that form the intermediate amorphous seed layer 472.

The upper amorphous seed layer 473 may be disposed on the intermediate amorphous seed layer 472. The upper amorphous seed layer 473 may be in direct contact with an upper surface of the intermediate amorphous seed layer 472. The side surface of the intermediate amorphous seed layer 472 may, for example, be vertically aligned or substantially vertically aligned with a side surface of the upper amorphous seed layer 473.

The upper amorphous seed layer 473 may have a different configuration from the configuration of the intermediate amorphous seed layer 472. For example, the upper amorphous seed layer 473 may include a conductive material that has a good adhesion characteristic to the intermediate amorphous seed layer 472 and to the crystalline seed layer 474.

For example, the upper amorphous seed layer 473 may include Ta. A vertical thickness of the upper amorphous seed layer 473 in a direction that is substantially parallel to the Z axis in FIG. 6 may be less than a vertical thickness of the intermediate amorphous seed layer 472.

The crystalline seed layer 474 may be disposed on the upper amorphous seed layer 473. The crystalline seed layer 474 may be in direct contact with an upper surface of the upper amorphous seed layer 473. The side surface of the upper amorphous seed layer 473 may, for example, be vertically aligned or substantially vertically aligned with a side surface of the crystalline seed layer 474.

Consequently, in the magnetic tunnel junction element of the semiconductor device according to an embodiment, the seed pattern 470 may include an oxidized seed layer 471 that is disposed close to the lower electrode 300. Therefore, in the magnetic tunnel junction element of the semiconductor device according to the embodiment, the seed pattern may provide the pinned magnetic pattern with a relatively high stability. Therefore, in the magnetic tunnel junction element of the semiconductor device according to an embodiment, degradation of the electromagnetic characteristic of the magnetic tunnel junction structure may effectively be prevented by the seed pattern.

Figure 7:
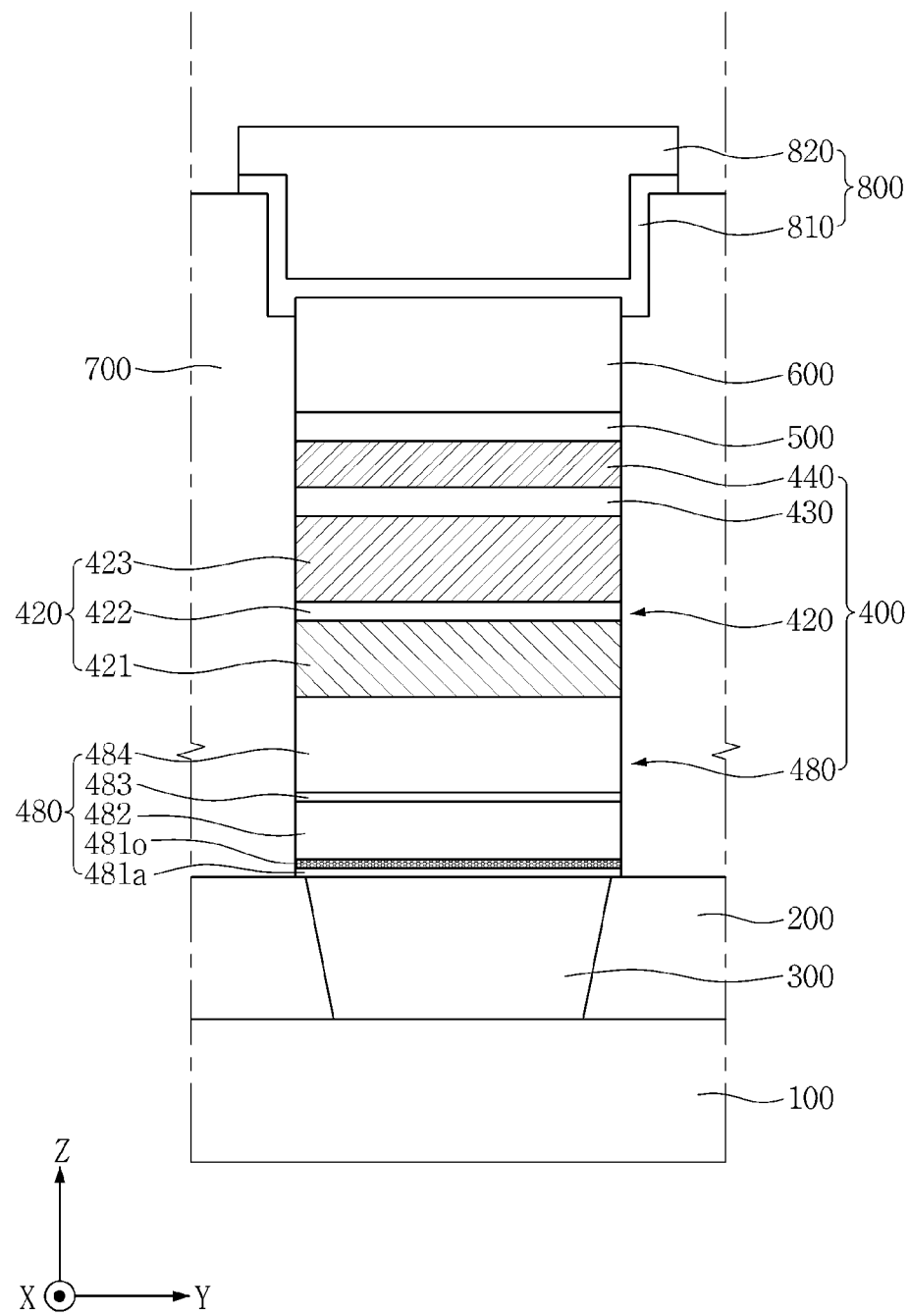

In the magnetic tunnel junction element of the semiconductor device according to an embodiment, the oxidized seed layer 471 may be in direct contact with the lower electrode 300. However, in a magnetic tunnel junction element according to another embodiment as shown in FIG. 7, a seed pattern 480 may include a lower amorphous seed layer 481a, an oxidized seed layer 481o that is disposed on the lower amorphous seed layer 481a, an intermediate amorphous seed layer 482 that is disposed on the oxidized seed layer 481o, an upper amorphous seed layer 483 that is disposed on the intermediate amorphous seed layer 482 and a crystalline seed layer 484 that is disposed on the upper amorphous seed layer 483.

The lower amorphous seed layer 481a may have a configuration that is different from the configuration of the intermediate amorphous seed layer 482 and from the configuration of the upper amorphous seed layer 483. For example, the lower amorphous seed layer 481a may not include materials that form the intermediate amorphous seed layer 482 and the lower amorphous seed layer 481a.

The oxidized seed layer 481o may include all materials that form the lower amorphous seed layer 481a. For example, the oxidized seed layer 481o may be formed as a surface of the lower amorphous seed layer 481a that is oxidized by an oxidation process.

Figure 8:
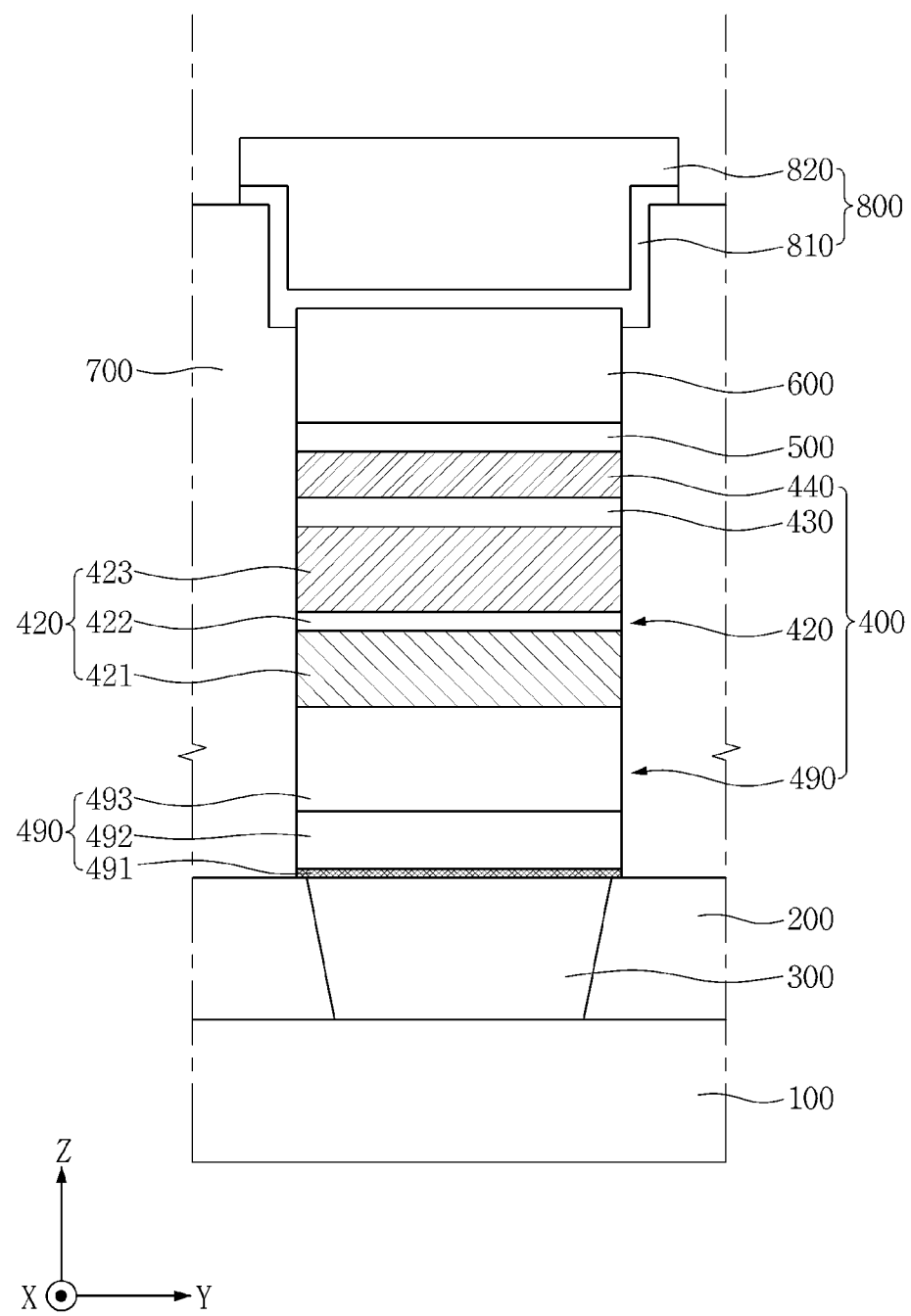

In the magnetic tunnel junction element of the semiconductor device according to an embodiment, the upper amorphous seed layer 473 may be disposed between the intermediate amorphous seed layer 472 and the crystalline seed layer 474. However, in a magnetic tunnel junction element of a semiconductor device according to another embodiment as shown in FIG. 8, a seed pattern 490 may include an intermediate amorphous seed layer 492 that is in direct contact with an oxidized seed layer 491 and a crystalline seed layer 493.

Figure 9A:
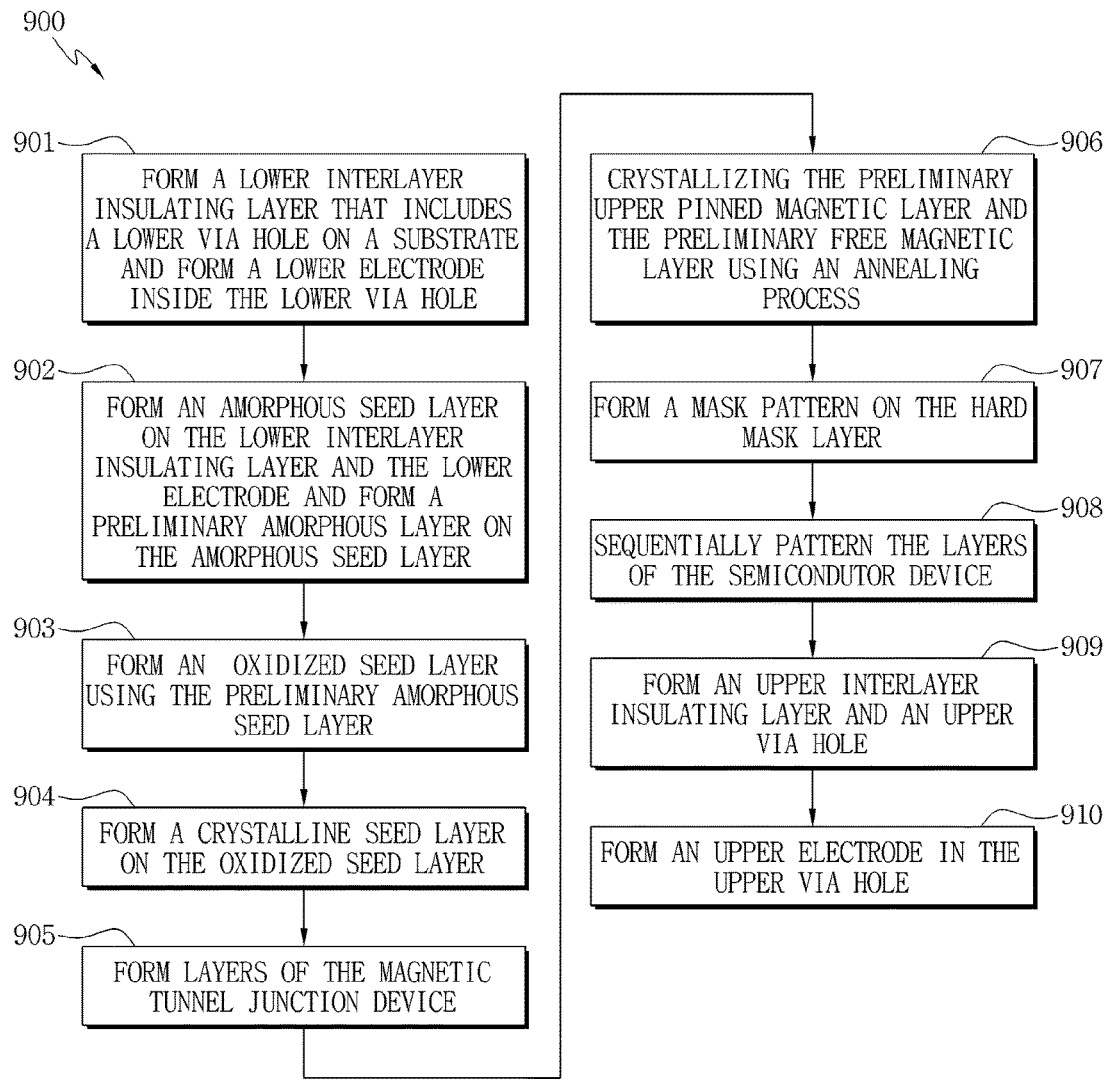
FIG. 9A depicts a flow diagram of a method of forming a semiconductor device according to an embodiment of the inventive concept.

FIG. 9A depicts a flow diagram of a method 900 of forming a semiconductor device according to an embodiment of the inventive concept. FIGS. 9B to 9K are views sequentially depicting a method of forming a semiconductor device according to an embodiment of the inventive concept that is depicted in FIG. 9A.

Figure 9B:
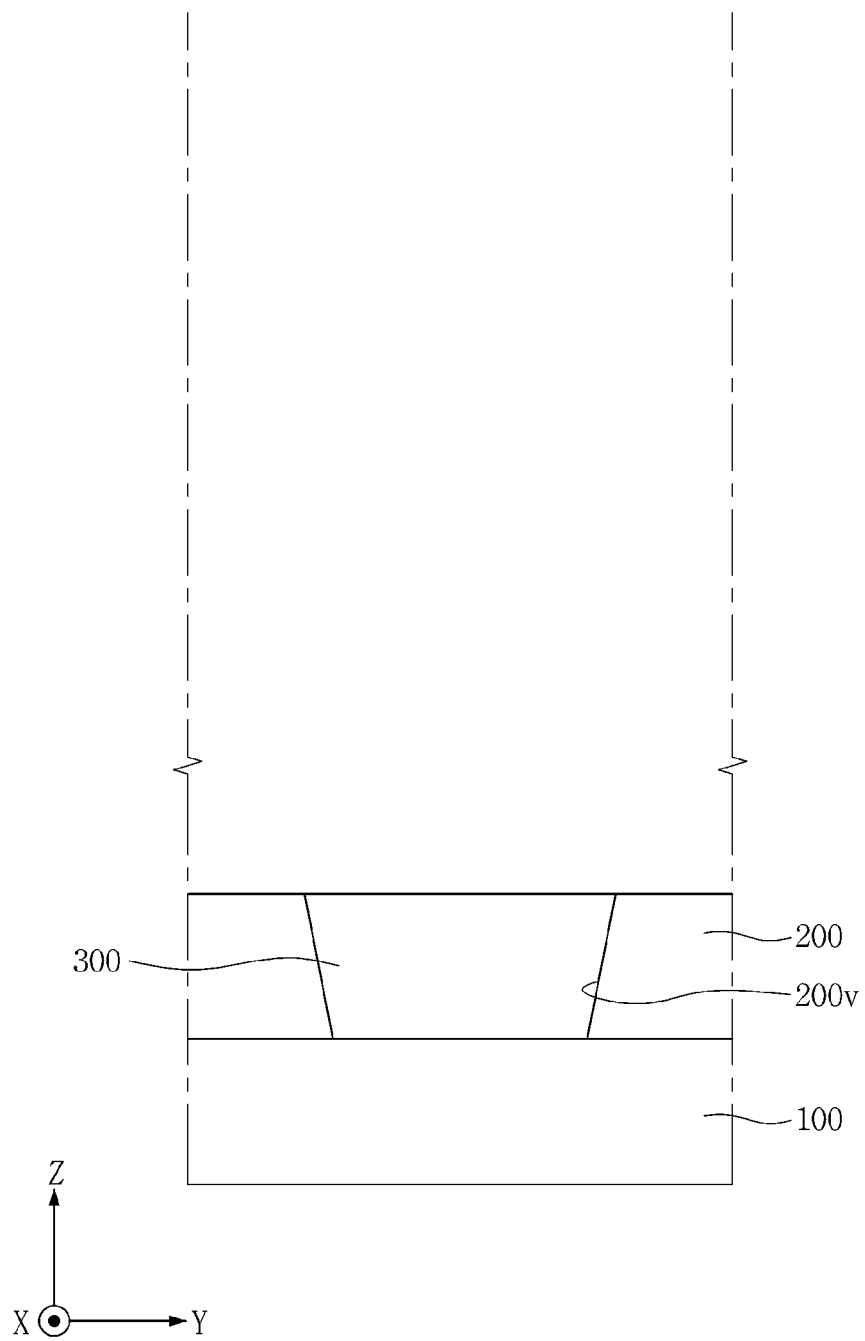
FIGS. 9B to 9K are views sequentially illustrating a method of forming a semiconductor device according to an embodiment of the inventive concept.

Referring to FIGS. 2 and 9A to 9K, the method of forming the semiconductor device according to the embodiment of the inventive concept will be described. First, at operation 901 in FIG. 9A, and as shown in FIG. 9B, the method of forming the semiconductor device according to an embodiment may include forming a lower interlayer insulating layer 200 that includes a lower via hole 200v on a substrate 100 and forming a lower electrode 300 inside the lower via hole 200v.

Forming the lower interlayer insulating layer 200 may include a forming at least one preliminary lower insulating layer that includes an insulating material, such as silicon oxide or silicon nitride, on the substrate 100, and forming the lower via hole 200v that passes substantially vertically through the preliminary lower insulating layer.

Forming the lower electrode 300 may include filling the lower via hole 200v with a conductive material. For example, forming the lower electrode 300 may include forming a lower conductive layer including a metal, such as Cu, W or Ti, on the lower interlayer insulating layer 200, and planarizing the lower conductive layer to expose an upper surface of the lower interlayer insulating layer 200. Planarizing the lower conductive layer may include a well-known chemical mechanical polishing (CMP) process.

Figure 9C:
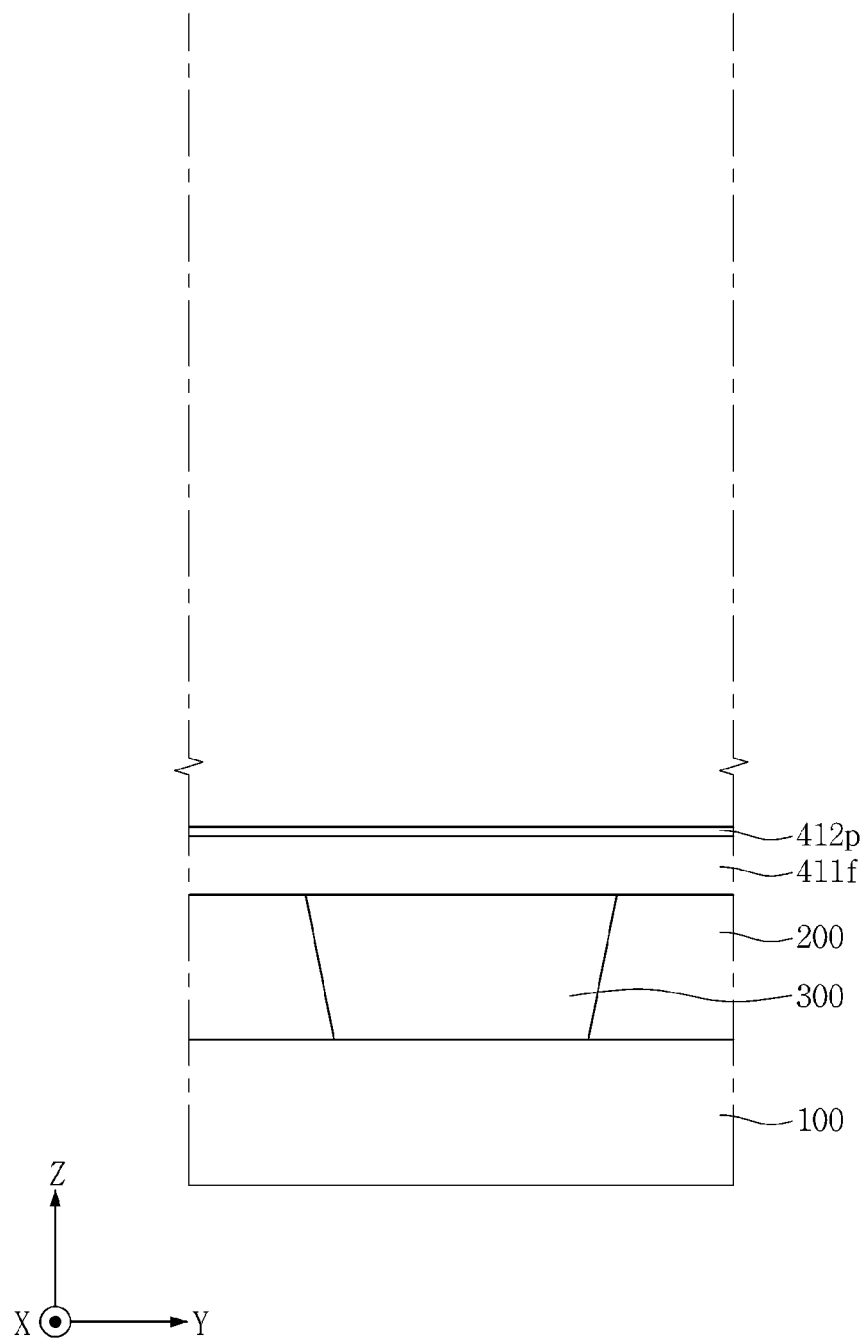

At operation 902 in FIG. 9A, and as shown in FIG. 9C, the method of forming the semiconductor device according to an embodiment may include forming an amorphous seed layer 411f on the lower interlayer insulating layer 200 and the lower electrode 300, and forming a preliminary amorphous layer 412p on the amorphous seed layer 411f.

The amorphous seed layer 411f and the preliminary amorphous layer 412p may be formed to be in an amorphous state. The preliminary amorphous layer 412p may be a configuration that is different from configuration of the amorphous seed layer 411f. For example, the preliminary amorphous layer 412p may include only some of materials that form the amorphous seed layer 411f.

The preliminary amorphous layer 412p may be formed to be thinner than the amorphous seed layer 411f. For example, in the method of forming the semiconductor device according to an embodiment, the preliminary amorphous layer 412p may be formed to have a thickness that is less than about 4 Å.

Figure 9D:
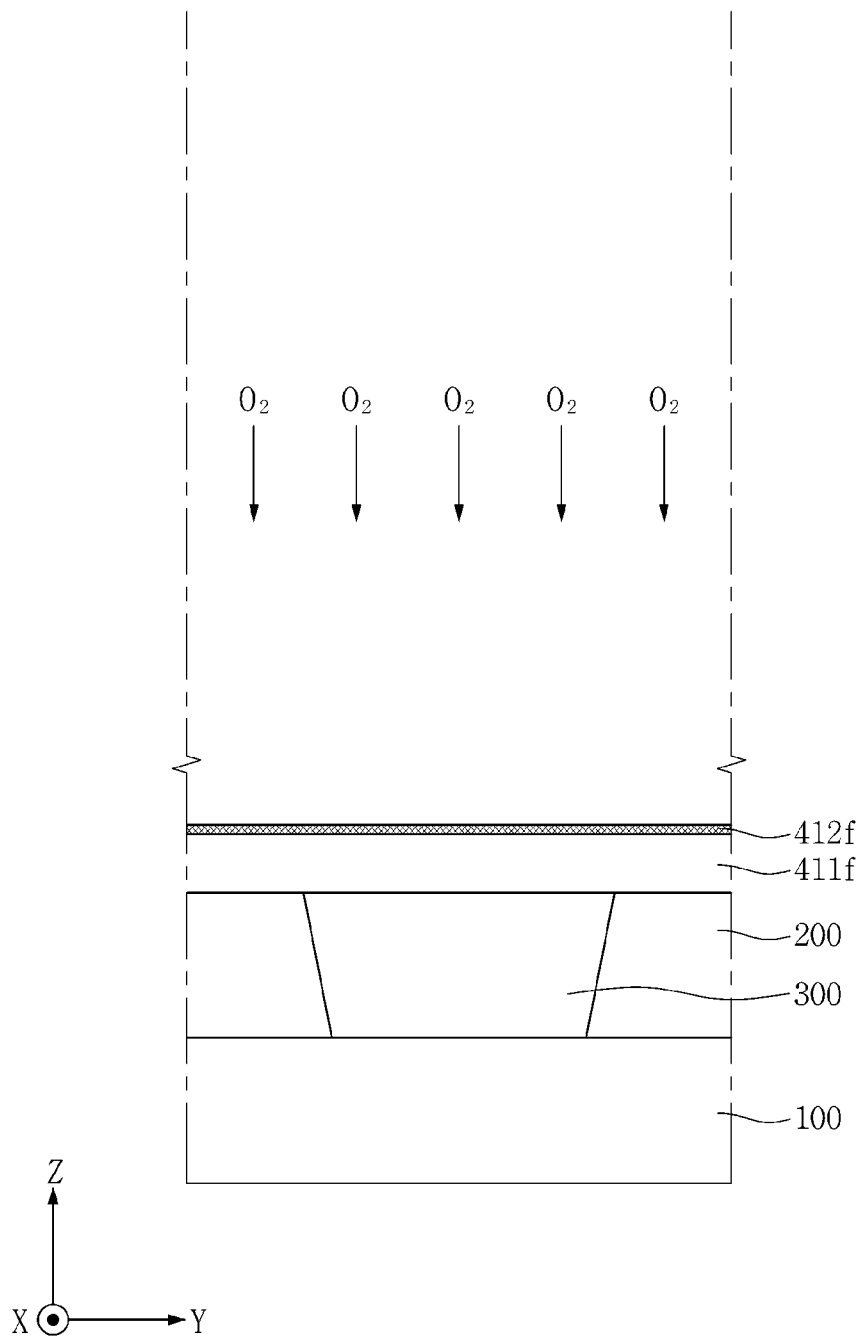

At operation 903 in FIG. 9A, and as shown in FIG. 9D, the method of forming the semiconductor device according to an embodiment may include forming an oxidized seed layer 412f using the preliminary amorphous layer 412p.

Forming the oxidized seed layer 412f may include oxidizing the preliminary amorphous layer 412p. Oxidizing the preliminary amorphous layer 412p may include a natural oxidation process. For example, oxidizing the preliminary amorphous layer 412p may include loading the preliminary amorphous layer 412p into a chamber at room temperature and performing natural oxidation on the preliminary amorphous layer 412p by introducing a small amount of oxygen gas (O2) into the chamber.

Figure 9E:
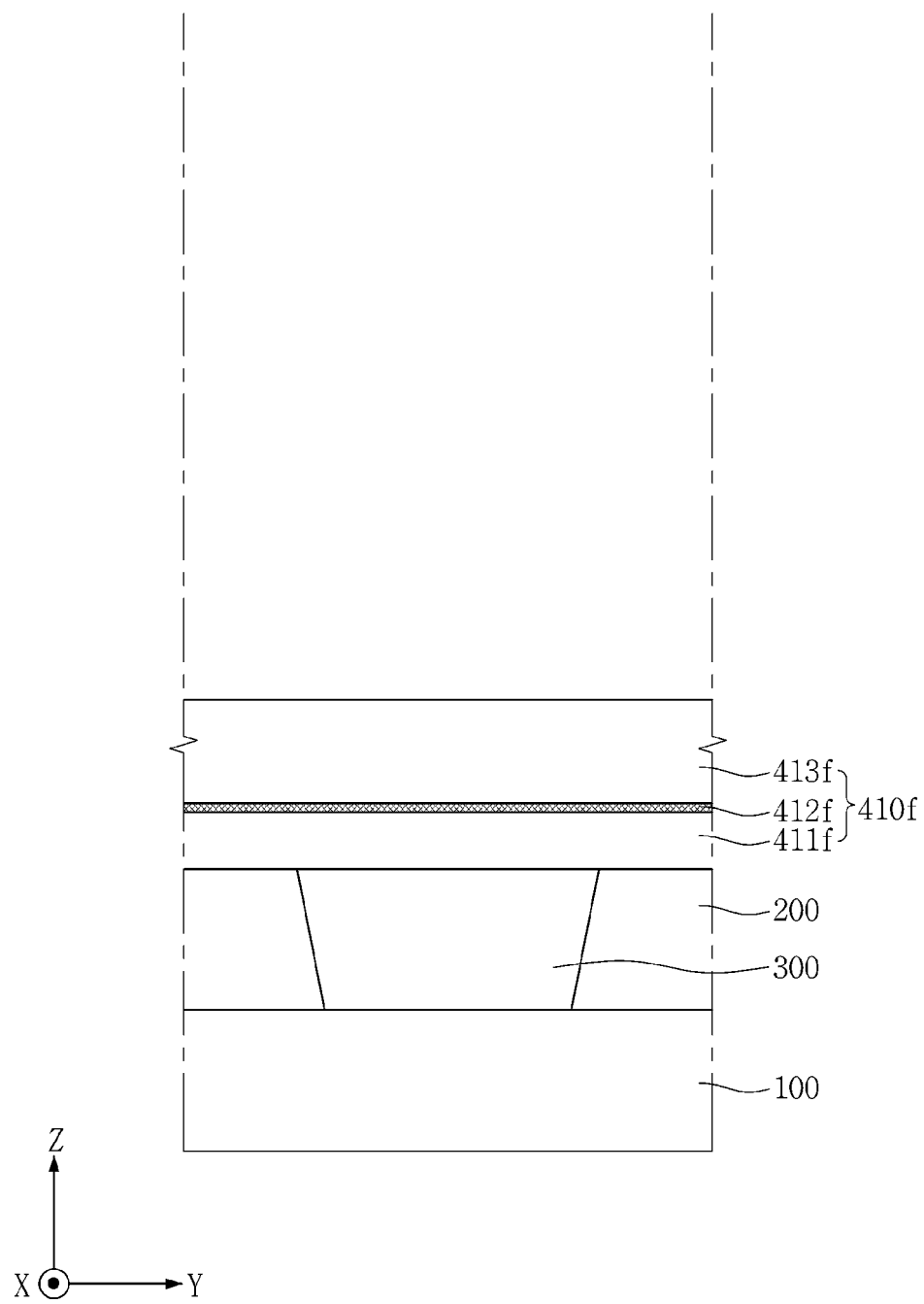

At operation 904 in FIG. 9A, and as shown in FIG. 9E, the method of forming the semiconductor device according to an embodiment may include forming a crystalline seed layer 413f on the oxidized seed layer 412f.

The crystalline seed layer 413f may be formed to be in a crystalline state. The crystalline seed layer 413f may be formed of materials that are different from the amorphous seed layer 411f and from the preliminary amorphous layer 412p.

A seed layer 410f may be formed from the amorphous seed layer 411f, the oxidized seed layer 412f and the crystalline seed layer 413f.

Figure 9F:
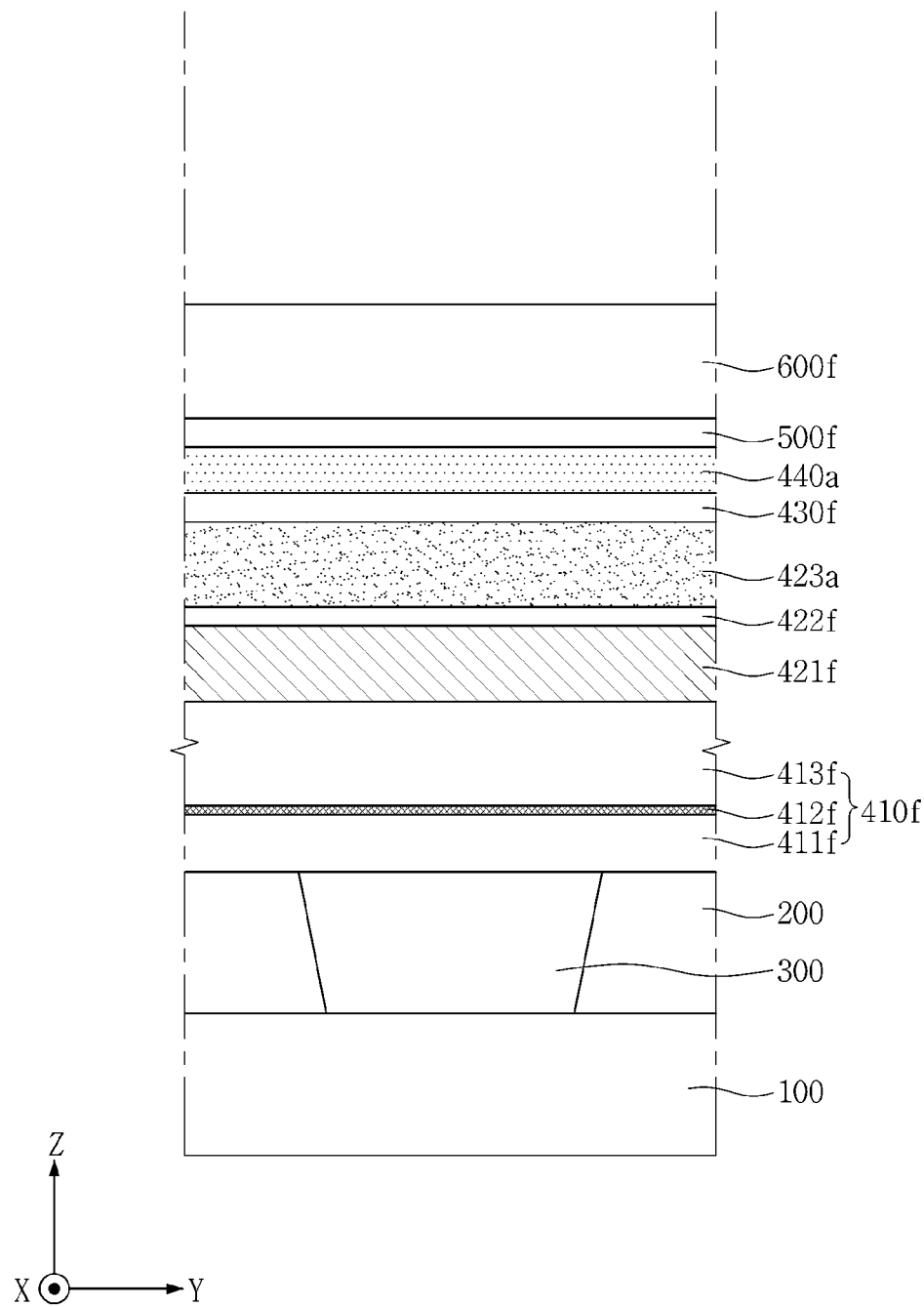

At operation 905 in FIG. 9A, and as shown in FIG. 9F, the method of forming the semiconductor device according to an embodiment may include forming a lower pinned magnetic layer 421*f* on the seed layer 410*f*, forming a spacer layer 422*f* on the lower pinned magnetic layer 421*f*, forming a preliminary upper pinned magnetic layer 423*a* on the spacer layer 422*f*, forming a tunnel barrier layer 430*f* on the preliminary upper pinned magnetic layer 423*a*, forming a preliminary free magnetic layer 440*a* on the tunnel barrier layer 430*f*, forming a capping layer 500*f* on the preliminary free magnetic layer 440*a*, and forming a hard mask layer 600*f* on the capping layer 500*f*. It should be understood that all of the operations depicted as being completed in FIG. 9F are all performed using well-known techniques.

The lower pinned magnetic layer 421*f* may be formed to be in a crystalline state. The preliminary upper pinned magnetic layer 423*a* and the preliminary free magnetic layer 440*a* may be formed to be in an amorphous state.

The method of forming the semiconductor device according to an embodiment may include forming the lower pinned magnetic layer 421*f* and the preliminary upper pinned magnetic layer 423*a* on the seed layer 410*f*, which includes the amorphous seed layer 411*f* and the oxidized seed layer 412*f*. Therefore, in the method of forming the semiconductor device according to an embodiment, a crystalline lattice structure the lower electrode 300 can effectively be prevented from adversely affecting the crystalline lattice structure of the lower pinned magnetic layer 421*f* and the preliminary upper pinned magnetic layer 423*a*.

Figure 9G:
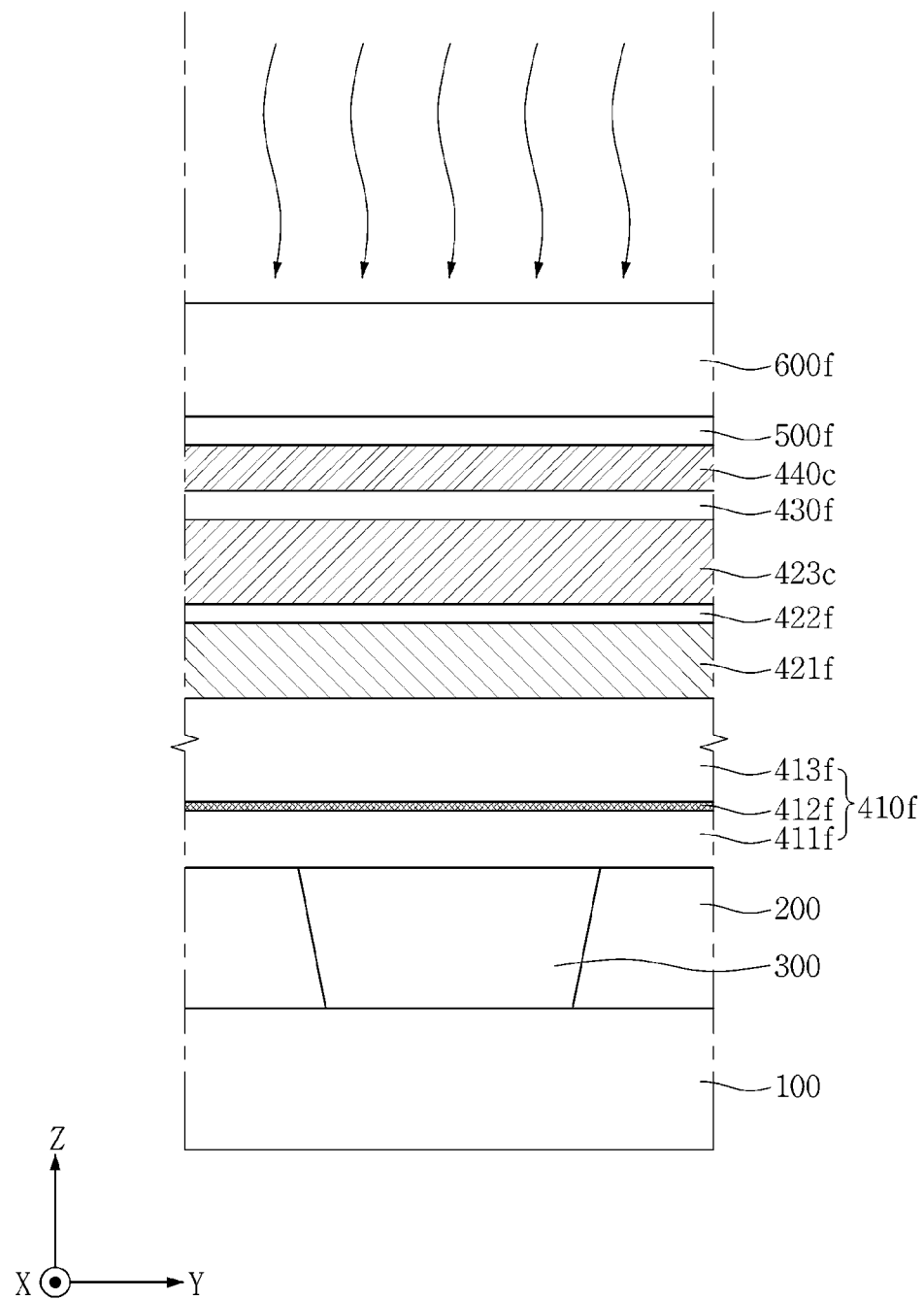

At operation 906 in FIG. 9A, and as shown in FIG. 9G, the method of forming the semiconductor device according to an embodiment may include forming an upper pinned magnetic layer 423*c* and a free magnetic layer 440*c* using the preliminary upper pinned magnetic layer 423*a* and the preliminary free magnetic layer 440*a* using well-known techniques.

Forming the upper pinned magnetic layer 423*c* and the free magnetic layer 440*c* may include crystallizing the preliminary upper pinned magnetic layer 423*a* and the preliminary free magnetic layer 440*a*. Crystallizing the preliminary upper pinned magnetic layer 423*a* and the preliminary free magnetic layer 440*a* may include annealing the substrate 100 on which the hard mask layer 600*f* is formed.

Figure 9H:
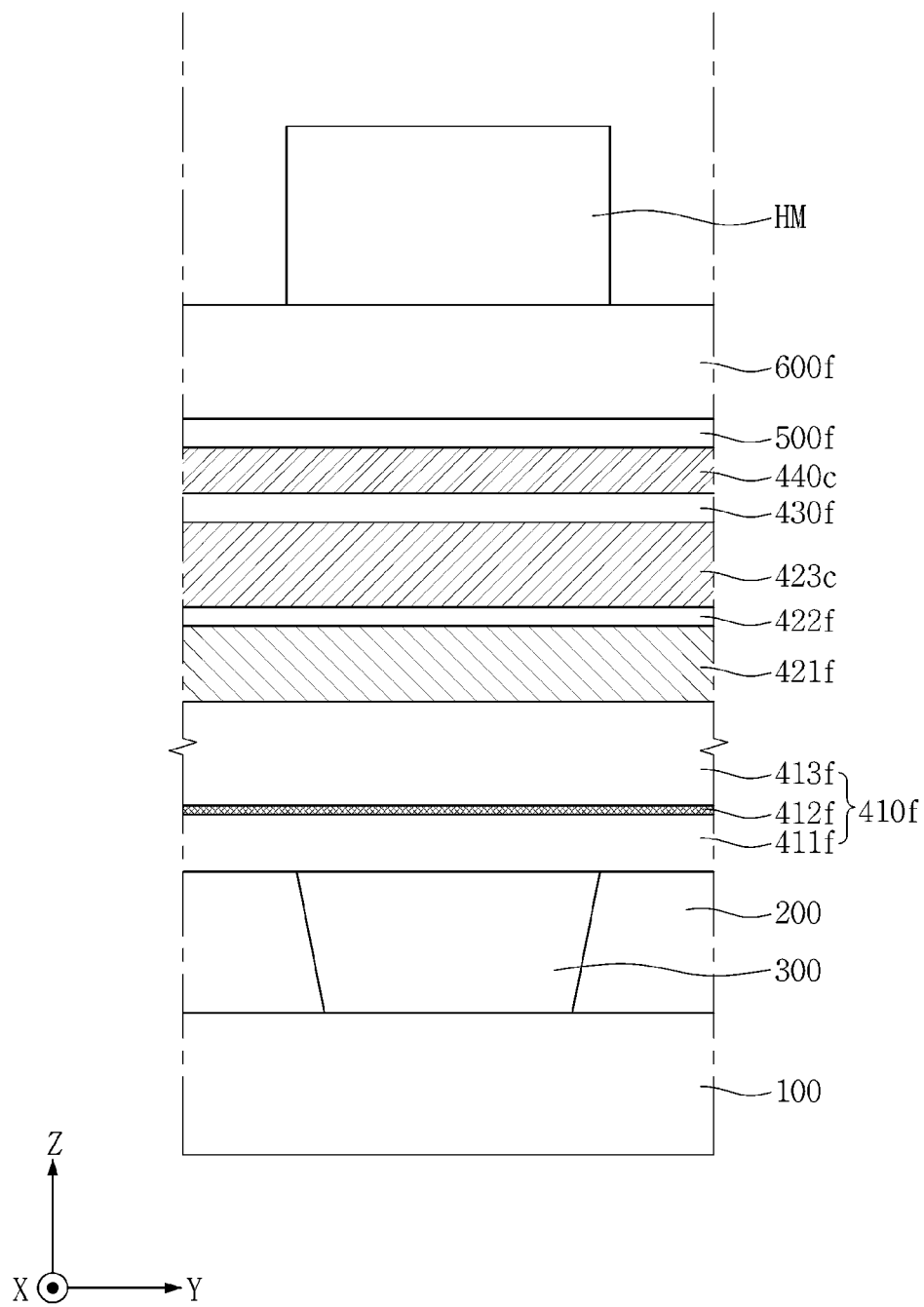

At operation 907 in FIG. 9A, and as shown in FIG. 9H, the method of forming the semiconductor device according to an embodiment may include forming a mask pattern HM on the hard mask layer 600*c*.

The mask pattern HM may vertically overlap the lower electrode 300. For example, the horizontal width of the mask pattern HM in a direction that is substantially parallel to the Y axis in FIG. 9H may be greater than the horizontal width of an upper surface of the lower electrode 300.

Figure 9I:
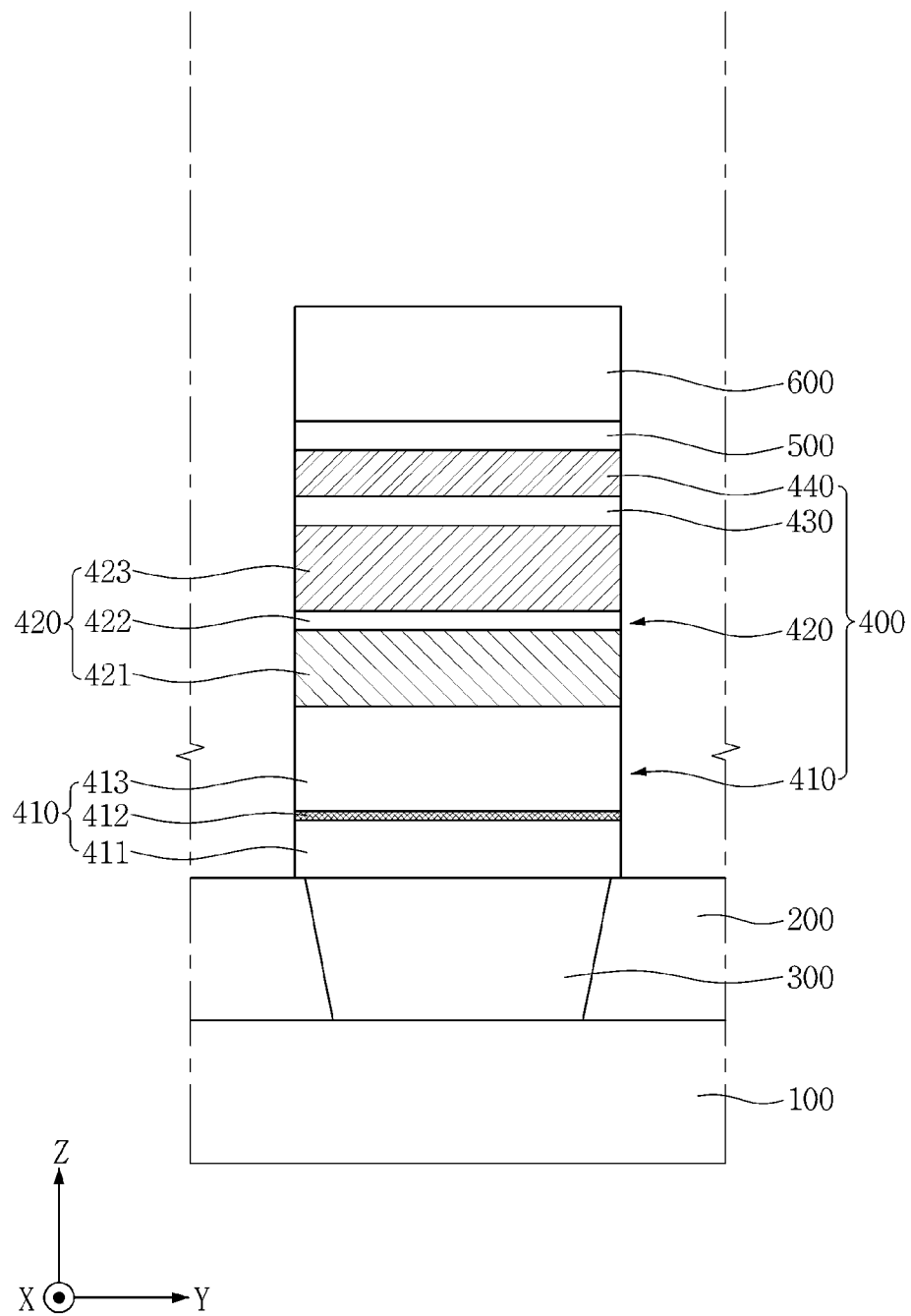

At operation 908 in FIG. 9A, and as shown in FIG. 9I, the method of forming the semiconductor device according to an embodiment may include a process of sequentially patterning the hard mask layer 600*c*, the capping layer 500*c*, the free magnetic layer 440*c*, the tunnel barrier layer 430*f*, the upper pinned magnetic layer 423*c*, the spacer layer 422*f*, the lower pinned magnetic layer 421*f* and the seed layer 410*f* using the mask pattern HM and a process of removing the mask pattern HM. It should be understood that all of the operations depicted as being completed in FIG. 9I are all performed using well-known techniques.

A hard mask pattern 600 may be formed by patterning the hard mask layer 600*c*. A capping pattern 500 may be formed patterning the capping layer 500*c*. A side surface of the capping pattern 500 may be vertically aligned or substantially vertically aligned with a side surface of the hard mask pattern 600. It should be understood that all of the operations used to pattern the hard mask layer 600*c* and the capping layer 500*c* are well-known techniques.

A magnetic tunnel junction structure 400 may be formed by sequentially patterning the free magnetic layer 440*c*, the tunnel barrier layer 430*f*, the upper pinned magnetic layer 423*c*, the spacer layer 422*f*, the lower pinned magnetic layer 421*f* and the seed layer 410*f*. The magnetic tunnel junction structure 400 may include a seed pattern 410, a pinned magnetic pattern 420, a tunnel barrier pattern 430 and a free magnetic pattern 440. A side surface of the magnetic tunnel junction structure 400 may, for example, be vertically aligned or substantially vertically aligned with the side surface of the capping pattern 500.

The pinned magnetic pattern 420 may include a lower pinned magnetic layer 421, a spacer 422, and an upper pinned magnetic layer 423. A side surface of the upper pinned magnetic layer 423 may, for example, be vertically aligned or substantially vertically aligned with a side surface of the tunnel barrier pattern 430. A side surface of the spacer 422 may, for example, be vertically aligned or substantially vertically aligned with the side surface of the upper pinned magnetic layer 423. A side surface of the lower pinned magnetic layer 421 may, for example, be vertically aligned or substantially vertically aligned with the side surface of the spacer 422.

The process of patterning the seed layer 410*f* may include sequentially patterning the crystalline seed layer 413*f*, the oxidized seed layer 412*f*, and the amorphous seed layer 411*f*. The seed pattern 410 may include an amorphous seed layer 411, an oxidized seed layer 412 and a crystalline seed layer 413. A side surface of the amorphous seed layer 411 may, for example, be vertically aligned or substantially vertically aligned with a side surface of the oxidized seed layer 412. The side surface of the oxidized seed layer 412 may be vertically aligned or substantially vertically aligned with a side surface of the crystalline seed layer 413.

Figure 9J:
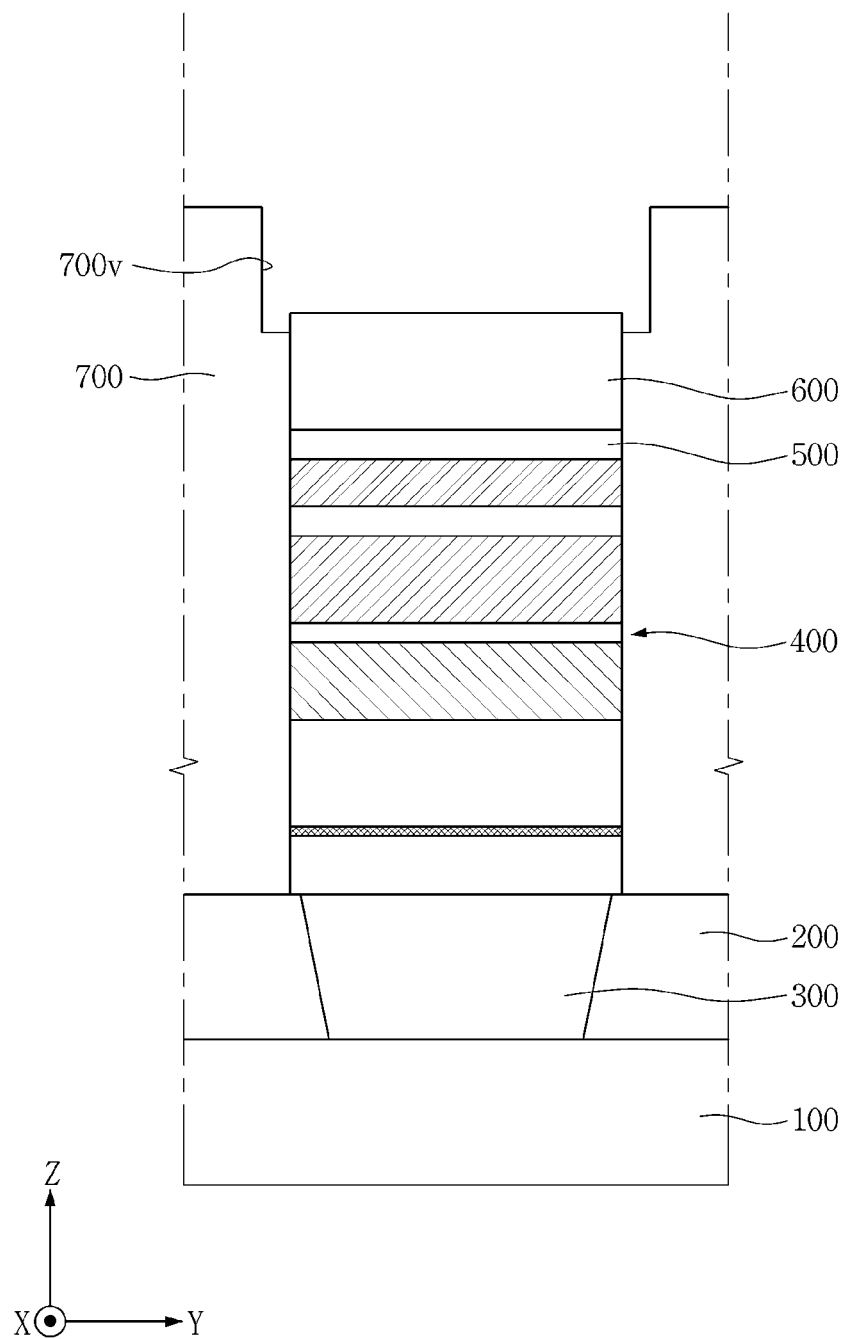

At operation 909 in FIG. 9A, and as shown in FIG. 9J, the method of forming the semiconductor device according to an embodiment may include forming an upper interlayer insulating layer 700 on the lower interlayer insulating layer 200 and forming an upper via hole 700*v* in the upper interlayer insulating layer 700.

Forming the upper interlayer insulating layer 700 may include covering the magnetic tunnel junction structure 400, the capping pattern 500 and the hard mask pattern 600 using a layer including an insulating material, such as silicon oxide.

Forming the upper via hole 700*v* may include exposing an upper surface of the hard mask pattern 600.

Figure 9K:
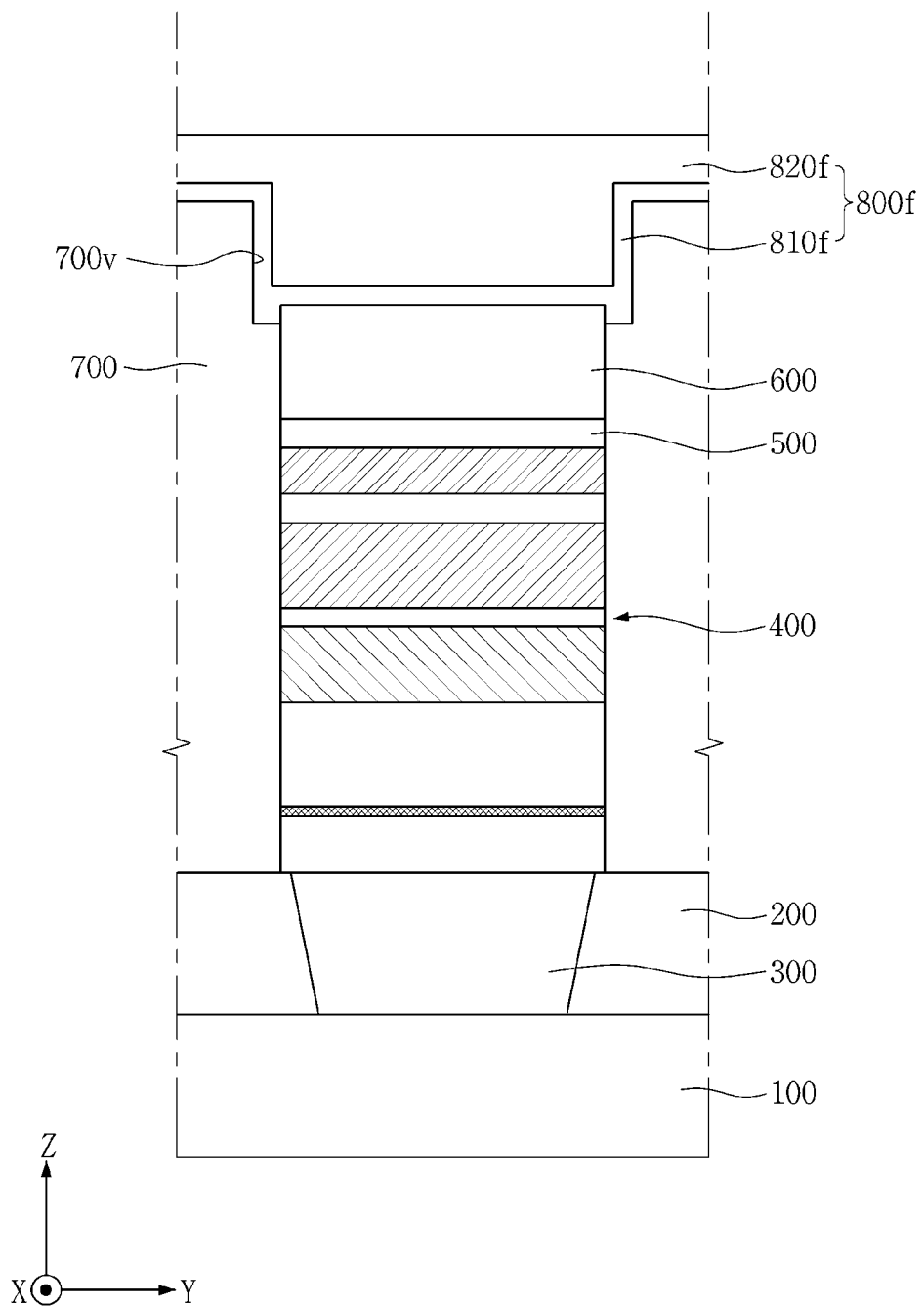

At operation 910 in FIG. 9A, and as shown in FIG. 9K, the method of forming the semiconductor device according to an embodiment may include forming an upper electrode layer 800*f* that fills the upper via hole 700*v* of the upper interlayer insulating layer 700.

Forming the upper electrode layer 800*f* may include a process of forming an upper barrier layer 810*f* on the upper interlayer insulating layer 700 and forming an upper conductive layer 820*f* on the upper barrier layer 810*f*.

As shown in FIG. 2, the method of forming the semiconductor device according to an embodiment may include forming an upper electrode 800 on the hard mask pattern 600.

Forming the upper electrode 800 may include patterning the upper electrode layer 800*f*. Patterning the upper electrode layer 800f may include sequentially patterning the upper conductive layer 820f and the upper barrier layer 810f.

Consequentially, the method of forming the semiconductor device according to an embodiment may include forming the lower pinned magnetic layer 421f and the upper pinned magnetic layer 423f on the seed layer 410f, which includes the oxidized seed layer 412f. Therefore, in the method of forming the semiconductor device according to an embodiment, the pinned magnetic pattern 420 may be formed to have a relatively high stability. Therefore, in the method of forming the semiconductor device according to an embodiment, degradation of electromagnetic characteristics of the magnetic tunnel junction structure 400 caused by the lower electrode 300 may effectively be prevented.

Figure 10A:
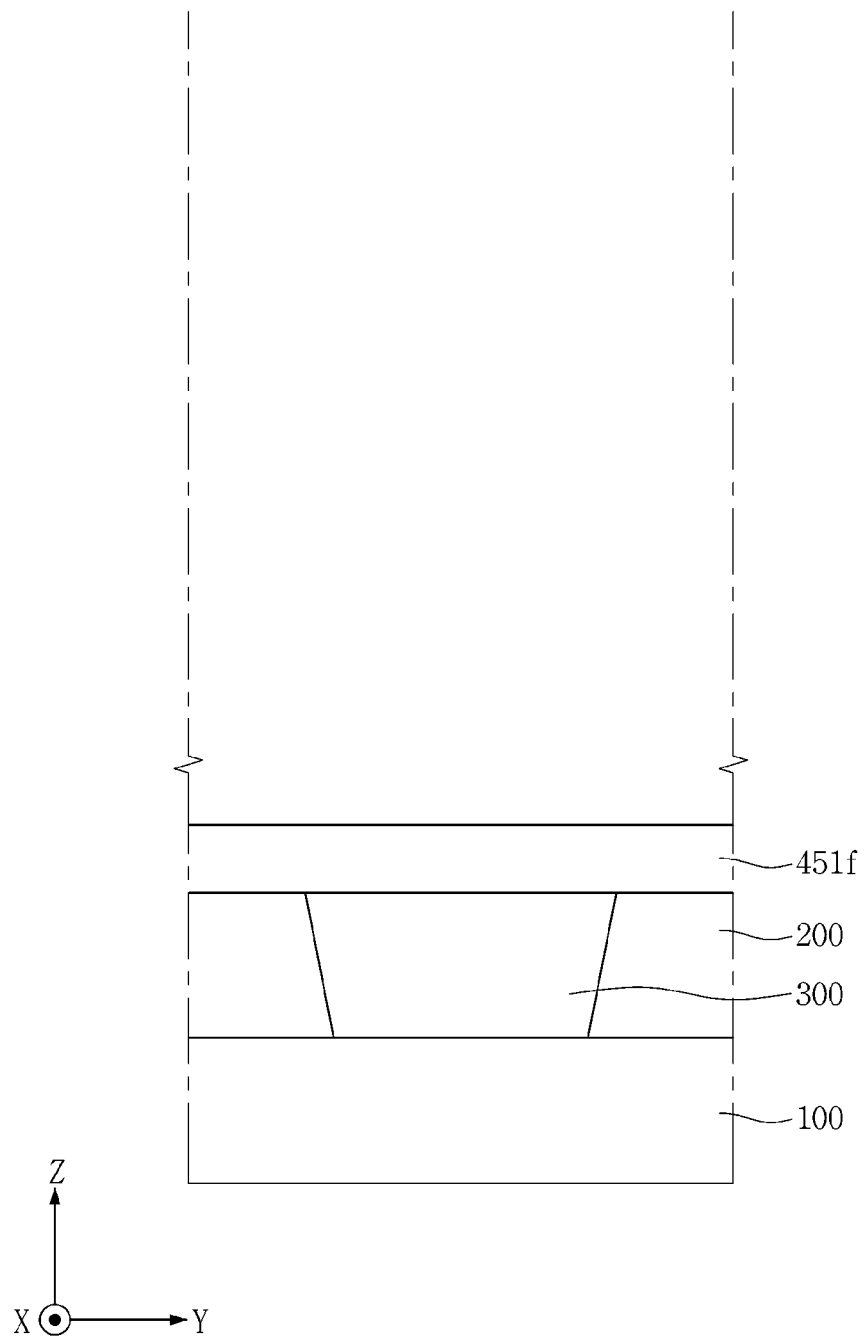
FIGS. 10A to 10C are views sequentially illustrating a method of forming a semiconductor device according to another embodiment of the inventive concept.
Figure 10B:
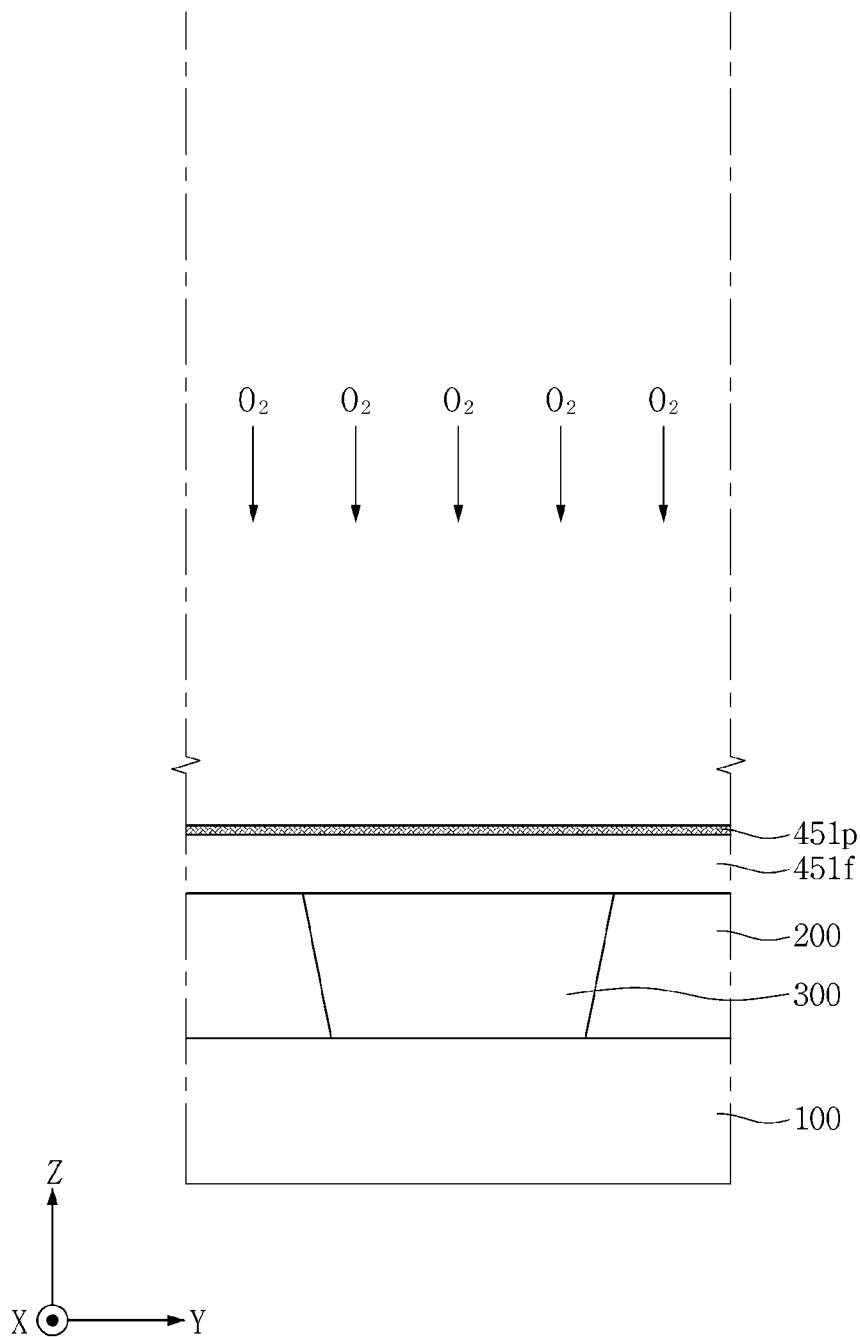
Figure 10C:
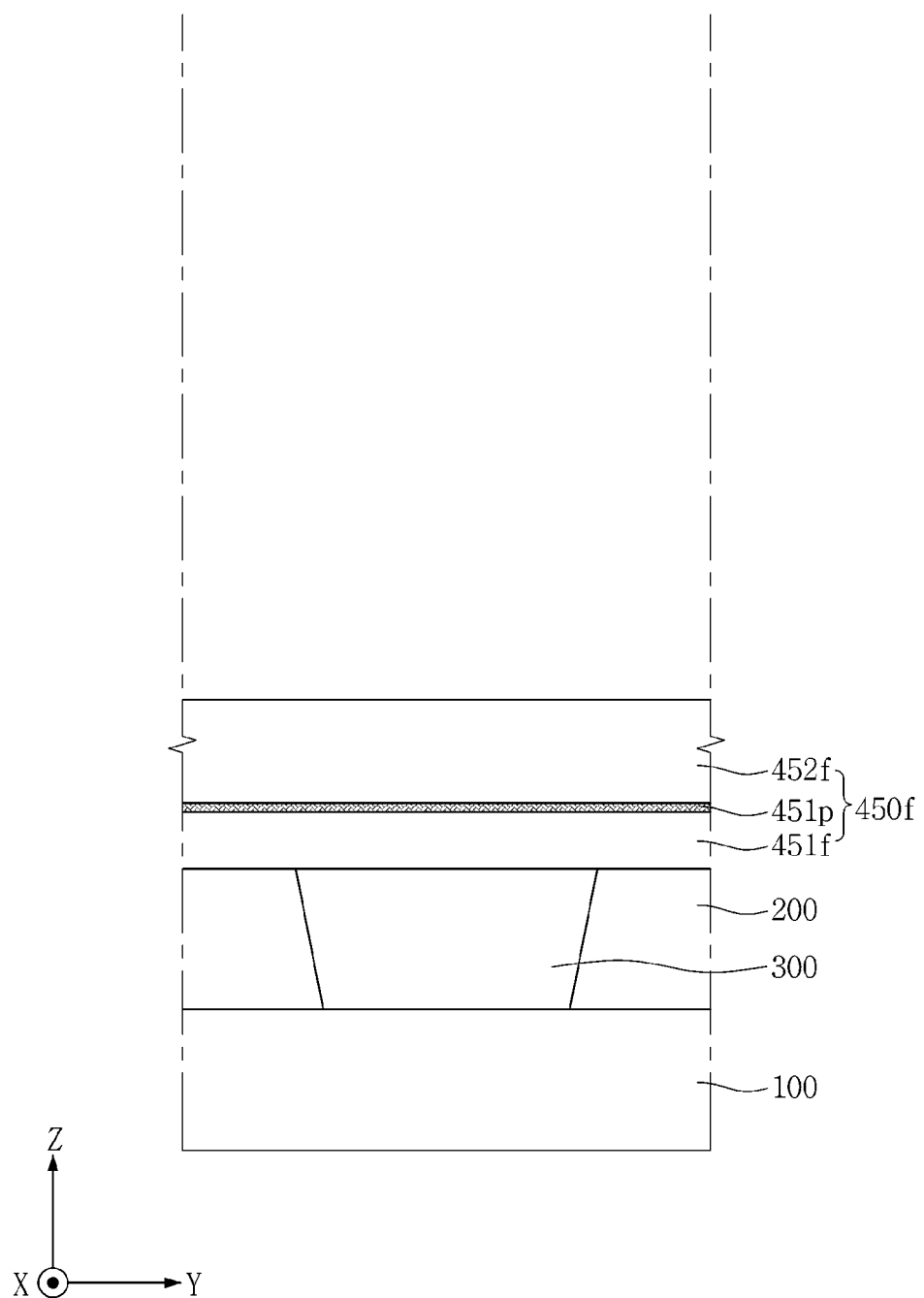

FIGS. 10A to 10C are views sequentially depicting a method of forming a semiconductor device according to another embodiment of the inventive concept.

Referring to FIGS. 5 and 10A to 10C, the method of forming the semiconductor device according to another embodiment will be described. First, as shown in FIG. 10A, the method of forming the semiconductor device according to another embodiment may include forming a lower interlayer insulating layer 200 that includes a lower via hole 200v on a substrate 100, forming a lower electrode 300 inside the lower via hole 200v, and forming an amorphous seed layer 451f on the lower interlayer insulating layer 200 and the lower electrode 300.

As shown in FIG. 10B, the method of forming the semiconductor device according to another embodiment may include forming an oxidized seed layer 451p on the amorphous seed layer 451f using an oxidation process.

Forming the oxidized seed layer 451p may include oxidizing an upper surface of the amorphous seed layer 451f. For example, forming the oxidized seed layer 451p may include performing a natural oxidation process on the upper surface of the amorphous seed layer 451f.

As shown in FIG. 10C, the method of forming the semiconductor device according to another embodiment may include forming a seed layer 450f on the lower interlayer insulating layer 200 and the lower electrode 300.

Forming the seed layer 450f may include forming a crystalline seed layer 452f on the oxidized seed layer 451p.

As shown in FIG. 5, the method of forming the semiconductor device according to an embodiment may include forming a magnetic tunnel junction structure 400 that includes a seed pattern 450 patterned from the seed layer 450f, a capping pattern 500 disposed on the magnetic tunnel junction structure 400, a hard mask pattern 600 disposed on the capping pattern 500, and an upper interlayer insulating layer 700 surrounding the magnetic tunnel junction structure 400, the capping pattern 500 and the hard mask pattern 600, and forming an upper electrode 800 in contact with an upper surface of the hard mask pattern 600.

Consequentially, the method of forming the semiconductor device according to an embodiment may include forming the oxidized seed layer 451p between the lower electrode 300 and the lower pinned magnetic layer 421f. Therefore, in the method of forming the semiconductor device according to an embodiment, the pinned magnetic pattern 420 may be formed to have a relatively high stability.

FIGS. 11A to 11D are views sequentially depicting a method of forming a semiconductor device according to another embodiment of the inventive concept.

Figure 11A:
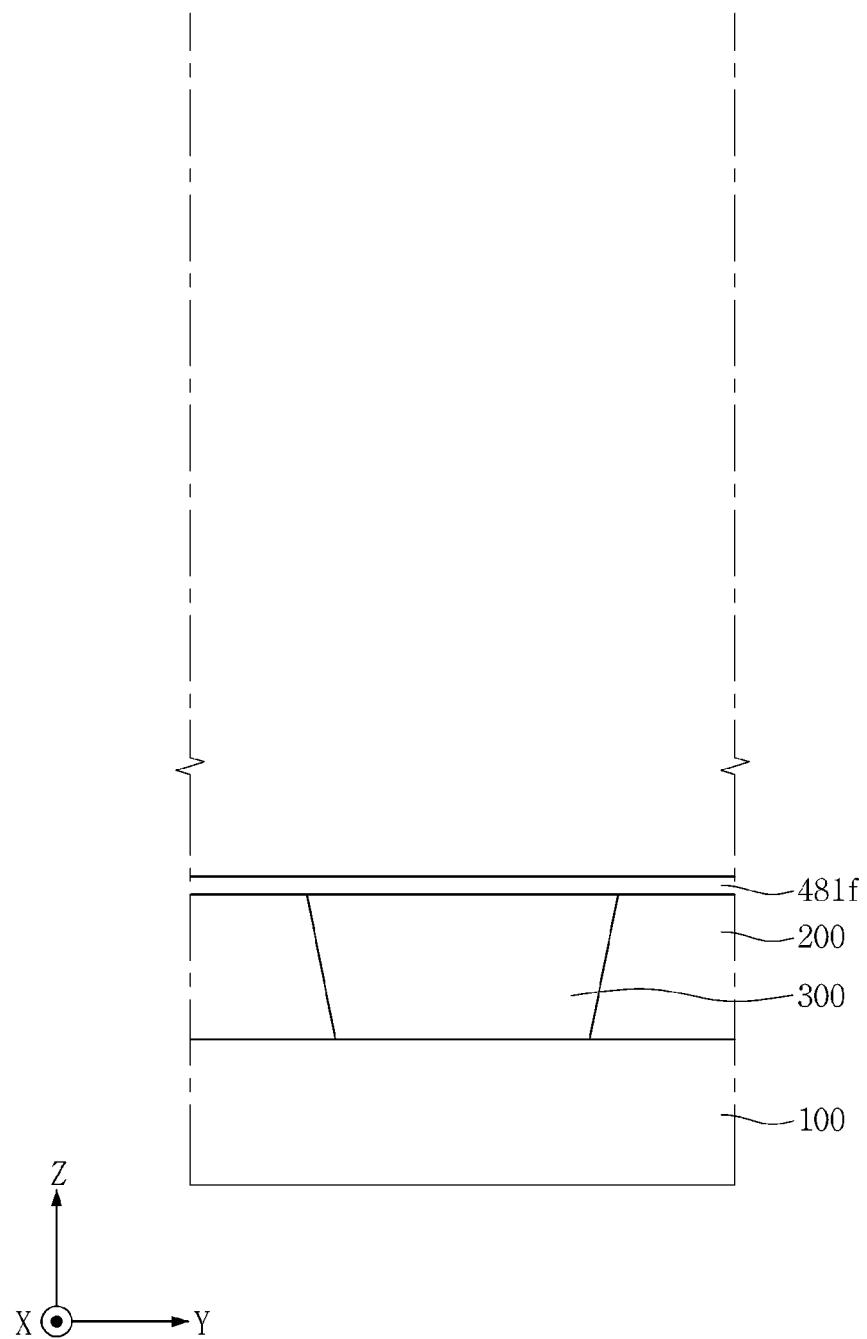
FIGS. 11A to 11D are views sequentially illustrating a method of forming a semiconductor device according to yet another embodiment of the inventive concept.

Referring to FIGS. 7 and 11A to 11D, the method of forming the semiconductor device according to an embodiment will be described. First, as shown in FIG. 11A, the method of forming the semiconductor device according to an embodiment may include forming a lower amorphous seed layer 481f on a substrate 100 in which a lower interlayer insulating layer 200 and a lower electrode 300 have been formed on the substrate 100.

Figure 11B:
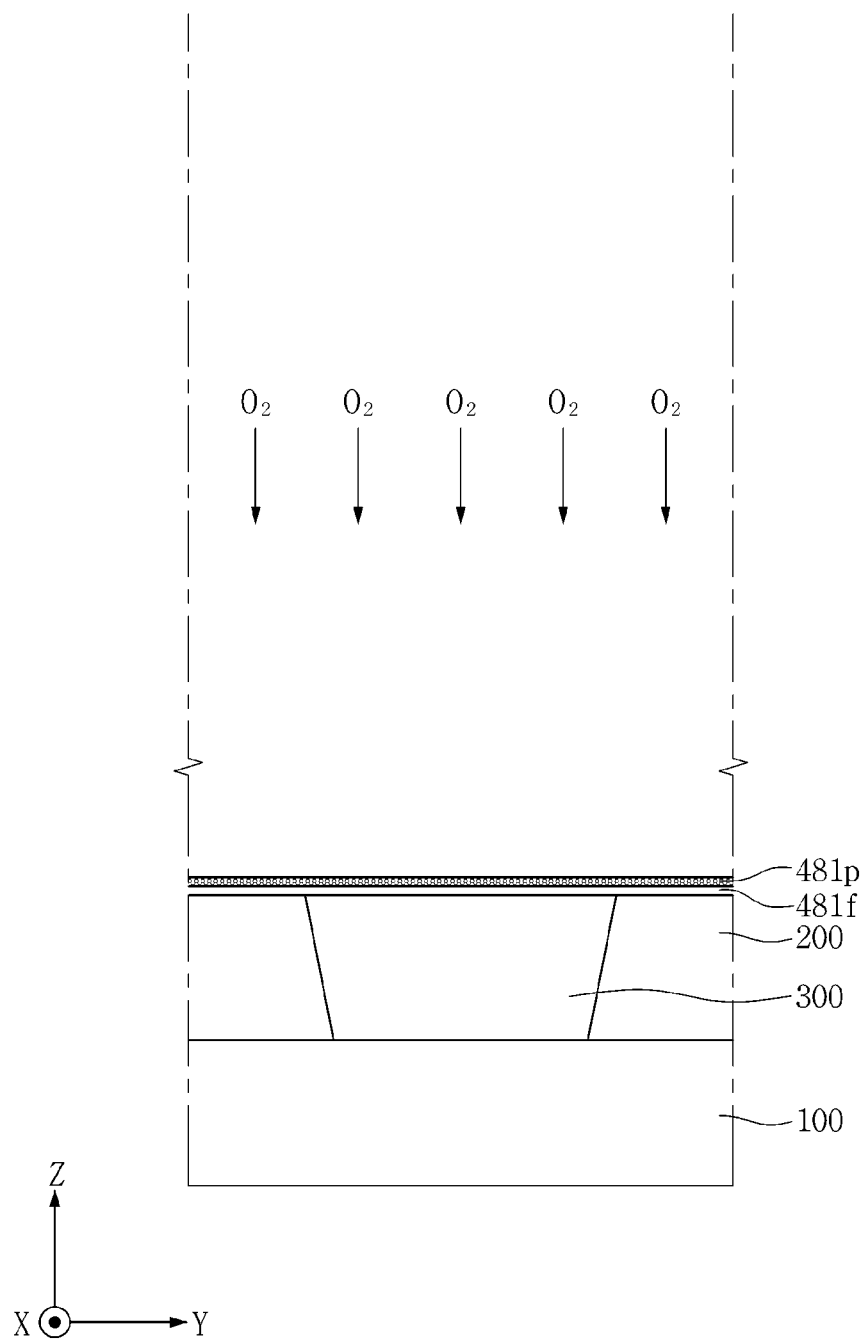

As shown in FIG. 11B, the method of forming the semiconductor device according to an embodiment may include forming an oxidized seed layer 481p on an upper surface of the lower amorphous seed layer 481f using an oxidation process.

Figure 11C:
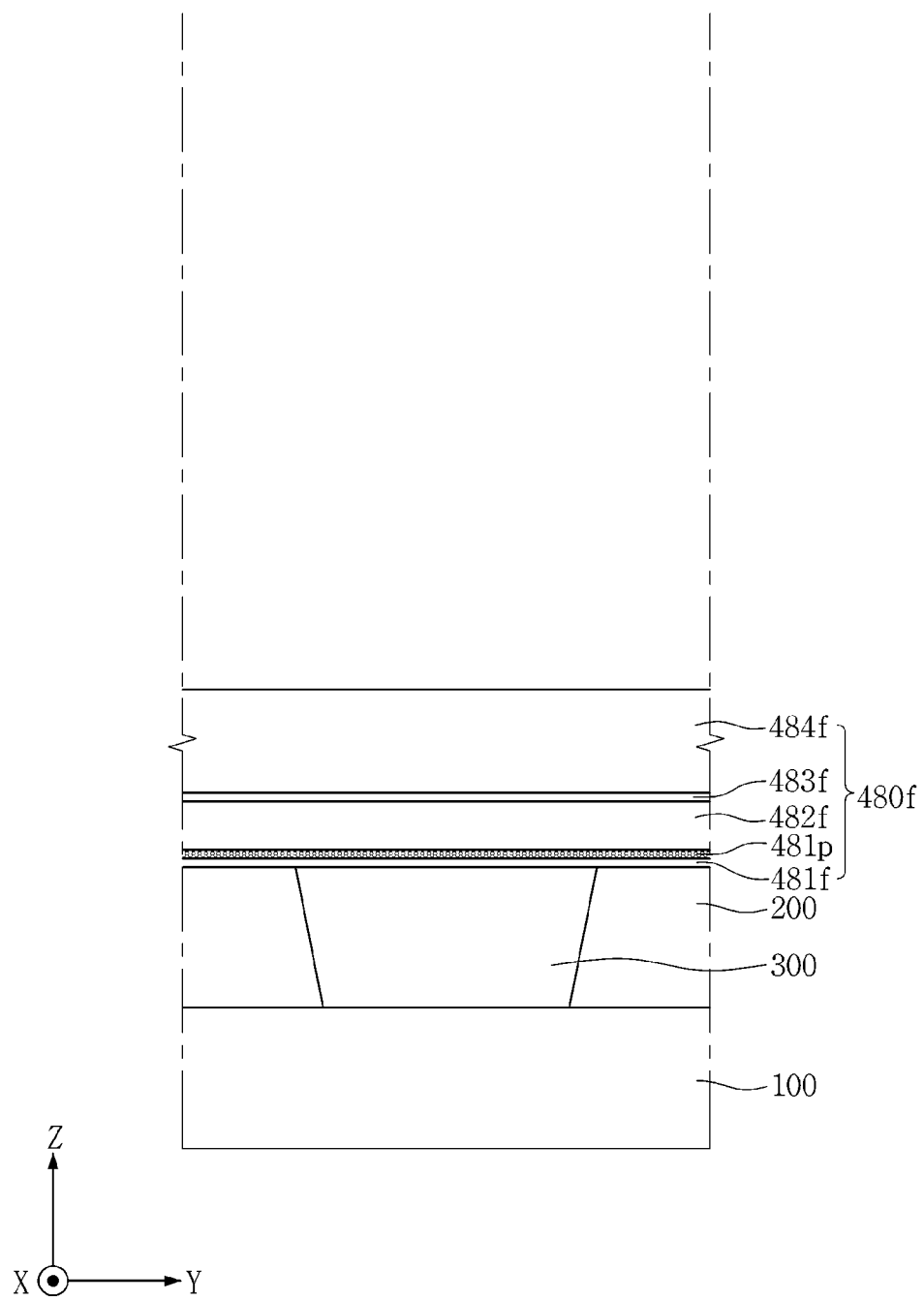

As shown in FIG. 11C, the method of forming the semiconductor device according to an embodiment may include forming an intermediate amorphous seed layer 482f, an upper amorphous seed layer 483f and a crystalline seed layer 484f on the oxidized seed layer 481p using well-known techniques. Thus, a seed layer 480f is formed from the oxidized seed layer 481p, the intermediate amorphous seed layer 482f, the upper amorphous seed layer 483f, and the crystalline seed layer 484f.

The intermediate amorphous seed layer 482f and the upper amorphous seed layer 483f may be formed of a material that is different from the material used to form the lower amorphous seed layer 481f. The intermediate amorphous seed layer 482f may be formed to be thicker in a direction that is substantially parallel to the Z-axis in FIG. 11C than the lower amorphous seed layer 481f. The upper amorphous seed layer 483f may be formed to be thinner in a direction that is substantially parallel to the Z-axis in FIG. 11C than the intermediate amorphous seed layer 482f.

Figure 11D:
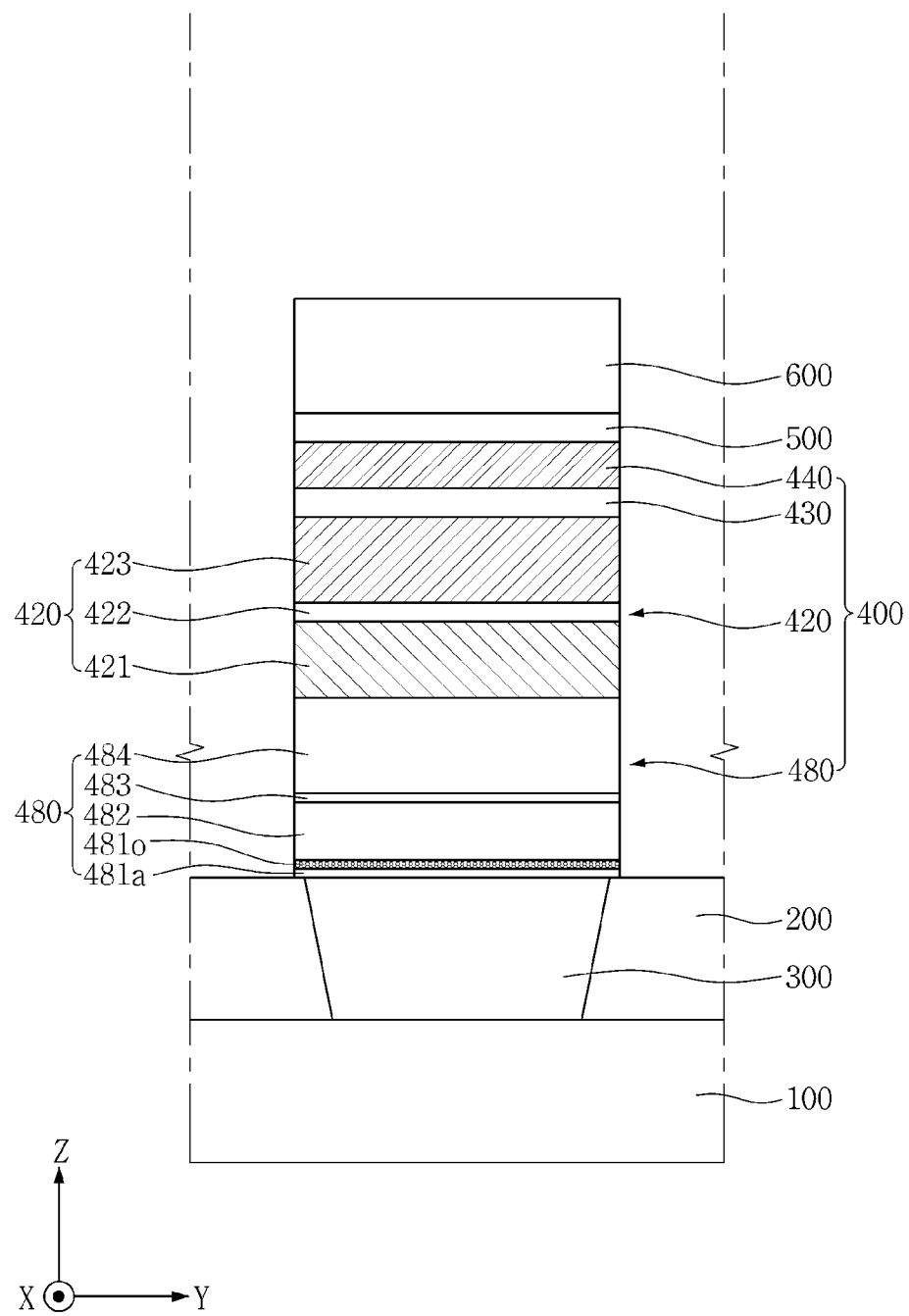

As shown in FIG. 11D, the method of forming the semiconductor device according to an embodiment may include forming a magnetic tunnel junction structure 400 on the lower electrode 300, forming a capping pattern 500 on the magnetic tunnel junction structure 400 and forming a hard mask pattern 600 on the capping pattern 500.

Forming the magnetic tunnel junction structure 400 may include sequentially forming a lower pinned magnetic layer, a spacer layer, an upper pinned magnetic layer, a tunnel barrier layer, and a free magnetic layer on the seed layer 480f using well-known techniques, and sequentially patterning the free magnetic layer, the tunnel barrier layer, the upper pinned magnetic layer, the spacer layer, the lower pinned magnetic layer, and the seed layer 480f using well-known techniques.

The magnetic tunnel junction structure may include a seed pattern 480 that is patterned from the seed layer 480f.

As shown in FIG. 7, the method of forming the semiconductor device according to an embodiment may include forming an upper interlayer insulating layer 700 and forming an upper electrode 800.

Consequentially, forming the semiconductor device according to an embodiment may include forming the oxidized seed layer 481p before the lower pinned magnetic layer 421f is formed. Therefore, in the method of forming the semiconductor device according to an embodiment, the lower electrode 300 can effectively be prevented from adversely affecting formation of the pinned magnetic pattern 420.

A semiconductor device according to the inventive concept and a method of forming the same can effectively prevent a lower electrode from adversely affecting crystalline lattice structure of a pinned magnetic pattern of a magnetic tunnel junction structure. Therefore, in the semiconductor device according to the inventive concept and the method of forming the same, degradation of electromagnetic characteristics of a magnetic tunnel junction structure caused by a lower electrode can effectively be prevented. Therefore, in the semiconductor device according to the inventive concept and the method of forming the same, the reliability of the semiconductor device can be enhanced.

The foregoing is illustrative of embodiments and is not to be construed as limiting thereof. Although a few embodiments have been described, those skilled in the art will readily appreciate that many modifications are possible without materially departing from the novel teachings and advantages.

What is claimed is:

1. A semiconductor device, comprising:
   a seed pattern;
   a pinned magnetic pattern disposed on the seed pattern;
   a tunnel barrier pattern disposed on the pinned magnetic pattern; and
   a free magnetic pattern disposed on the tunnel barrier pattern,
   wherein the seed pattern includes a first amorphous seed layer, an oxidized seed layer disposed on a surface of the first amorphous seed layer, and a crystalline seed layer disposed on the oxidized seed layer, and
   wherein the oxidized seed layer is disposed between the first amorphous seed layer and the crystalline seed layer.

2. The semiconductor device of claim 1, wherein a side surface of the oxidized seed layer is substantially vertically aligned with a side surface of the first amorphous seed layer.

3. The semiconductor device of claim 1, wherein the oxidized seed layer is disposed on the surface of the first amorphous seed layer proximate to the pinned magnetic pattern.

4. The semiconductor device of claim 3, wherein a vertical thickness of the oxidized seed layer is less than a vertical thickness of the first amorphous seed layer.

5. The semiconductor device of claim 3, wherein the seed pattern further includes a second amorphous seed layer disposed between the first amorphous seed layer and the oxidized seed layer, and wherein a configuration of the second amorphous seed layer is different from a configuration of the first amorphous seed layer.

6. The semiconductor device of claim 5, wherein materials that form the oxidized seed layer include substantially all materials that form the second amorphous seed layer.

7. The semiconductor device of claim 5, wherein a side surface of the second amorphous seed layer is substantially vertically aligned with a side surface of the oxidized seed layer.

8. The semiconductor device of claim 5, wherein a vertical thickness of the second amorphous seed layer is less than a vertical thickness of the first amorphous seed layer.

9. The semiconductor device of claim 1, wherein the oxidized seed layer includes an oxidized material of at least one material that forms the amorphous seed layer.

10. A semiconductor device, comprising:
    a lower electrode;
    an amorphous seed layer disposed on the lower electrode;
    an oxidized seed layer disposed on and in direct contact with the amorphous seed layer;
    a crystalline seed layer disposed on and in direct contact with the oxidized seed layer;
    a pinned magnetic pattern disposed on and in direct contact with the crystalline seed layer;
    a tunnel barrier pattern disposed on the pinned magnetic pattern; and
    a free magnetic pattern disposed on the tunnel barrier pattern.

11. The semiconductor device of claim 10, wherein the pinned magnetic pattern includes a lower pinned magnetic layer disposed in close proximity to the crystalline seed layer, an upper pinned magnetic layer disposed in close proximity to the tunnel barrier pattern, and a spacer disposed between the lower pinned magnetic layer and the upper pinned magnetic layer, and wherein a vertical thickness of the oxidized seed layer is less than a vertical thickness of the spacer.

12. The semiconductor device of claim 10, wherein the oxidized seed layer includes at least one of material that forms the amorphous seed layer.

13. The semiconductor device of claim 10, wherein a side surface of the oxidized seed layer is substantially vertically aligned with a side surface of the pinned magnetic pattern.

14. A semiconductor device, comprising:
    a seed layer comprising a first layer and a second layer, the first layer comprising a first lattice structure and the second layer comprising a second lattice structure that is different from the first lattice structure;
    a pinned magnetic layer on the second layer of the seed layer;
    a tunnel barrier layer on the pinned magnetic layer; and
    a free magnetic layer on the tunnel barrier pattern,
    wherein the first layer comprises an amorphous lattice structure, and the second layer comprises a crystalline lattice structure,
    wherein the seed layer further comprises a third layer between the first layer and the second layer, and
    wherein a lattice structure of the third layer comprises an oxidized lattice structure of the amorphous lattice structure of the first layer.

15. The semiconductor device of claim 14, wherein the third layer comprises an oxidized material of Ta or B.

16. The semiconductor device of claim 14, wherein the third layer comprises a thickness of less than about 4 Å, and wherein the thickness of the third layer is in a direction that is substantially parallel to a direction between the seed layer and the free magnetic layer.

17. The semiconductor device of claim 14, further comprising a lower electrode, and
    wherein the first layer of the seed layer is on the lower electrode.

18. The semiconductor device of claim 17, further comprising an upper electrode on the free magnetic layer.

19. The semiconductor device of claim 18, further comprising a capping layer and a hard mask layer between the free magnetic layer and the upper electrode.

* * * * *